(12) United States Patent
Lee et al.

(10) Patent No.: US 7,697,344 B2
(45) Date of Patent: Apr. 13, 2010

(54) MEMORY DEVICE AND METHOD OF OPERATING AND FABRICATING THE SAME

(75) Inventors: Chang-Hyun Lee, Suwon (KR); Byeong-In Choi, Yongln (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 78 days.

(21) Appl. No.: 11/898,252

(22) Filed: Sep. 11, 2007

(65) Prior Publication Data

US 2008/0106934 A1    May 8, 2008

(30) Foreign Application Priority Data

Nov. 3, 2006 (KR) ............ 10-2006-0108528
Feb. 13, 2007 (KR) ............ 10-2007-0014989

(51) Int. Cl.
*G11C 11/34* (2006.01)

(52) U.S. Cl. ............... 365/185.26; 365/185.24

(58) Field of Classification Search ............ 365/185.26, 365/185.24
See application file for complete search history.

(56) References Cited

U.S. PATENT DOCUMENTS

| 6,674,122 | B2 | 1/2004 | Kamigaki et al. |
| 6,784,481 | B2 | 8/2004 | Shin et al. |
| 6,844,587 | B2 | 1/2005 | Kang |
| 6,878,988 | B1 * | 4/2005 | Lee et al. ............... 257/324 |
| 7,081,651 | B2 * | 7/2006 | Choi et al. ............... 257/324 |
| 7,399,672 | B2 * | 7/2008 | Lee et al. ............... 438/257 |
| 2006/0240623 | A1 * | 10/2006 | Lee et al. ............... 438/257 |

OTHER PUBLICATIONS

Masatoshi Fukuda et al. "New Nonvolatile Memory With Charge-Trapping Sidewall". IEEE Electron Device Letters, vol. 24, No. 8, pp. 490-492. Jul. 2003.
Hyunjin Lee et al. "Characteristics of MOSFET with Non-Overlapped Source-Drain to Gate Region". $23^{rd}$ International conference on microelectronics. vol. 2, pp. 439-441. May 2002.

* cited by examiner

*Primary Examiner*—Michael T Tran
(74) *Attorney, Agent, or Firm*—Harness, Dickey & Pierce, P.L.C.

(57) ABSTRACT

A memory transistor including a substrate, a tunnel insulating pattern on the substrate, a charge storage pattern on the tunnel insulating pattern, a blocking insulating pattern on the charge storage pattern, and a gate electrode on the blocking insulating pattern, the blocking insulating pattern surrounding the gate electrode and methods of operating and fabricating the same. A nonvolatile memory may further include a plurality of memory transistors in series and a plurality of auxiliary structures between each of the plurality of unit transistors in series. Each of the plurality of auxiliary structures may be a dummy mask pattern or an assistant gate structure.

31 Claims, 19 Drawing Sheets

MEMORY DEVICE AND METHOD OF OPERATING AND FABRICATING THE SAME

PRIORITY STATEMENT

This application claims priority under 35 U.S.C. § 119 to Korean Patent Application No. 10-2006-0108528 filed on Nov. 3, 2006 and Korean Patent Application No. 10-2007-0014989 filed on Feb. 13, 2007, the contents of which are herein incorporated by reference in their entirety for all purposes.

BACKGROUND

1. Field

Example embodiments relate to a storage device, for example, to a device and a method for operating and manufacturing a non-volatile and electrically erasable semiconductor memory device, for example, a flash memory.

2. Description of the Related Art

Non-volatile memory retains information stored in its memory cells even when no power is supplied. Examples include mask ROM, EPROM, and EEPROM.

Non-volatile memory is widely used in various kind of electronic products, for example, personal computers, personal digital assistants (PDAs), cellular phones, digital still cameras, digital video cameras, video game players, memory cards, and other electronic devices.

Memory cards types may include multimedia cards (MMC), secure digital (SD) cards, compact flash cards, memory sticks, smart media cards, and extreme digital (xD) picture cards.

Among non-volatile memory devices, a flash memory is widely used. Flash memory may be divided into a Not-OR (NOR) type and a Not-AND (NAND) type based on a connection structure of cells and bit lines. Because a read speed is faster and a write operation is slower, a NOR-type flash memory may be used as a code memory. Because a write speed is faster and a price per unit area is lower, a NAND-type flash memory may be used as a mass storage device.

NOR-type flash memory may be used in BIOS/networking in a PC, a router, or a hub or in a telecommunications switcher. NOR-type flash memory may also be used to store code or data for cellular phones, personal digital assistants (PDAs), POS, or PCA.

NAND-type flash memory may be used in memory cards for mobile computers, digital cameras, both still and moving, near-CD quality voice and audio recorders, rugged and reliable storage, for example, solid-state disks.

The programming method for NOR-type flash memory is hot carrier injection and the programming method for NAND-type flash memory is Fowler-Nordheim (FN) tunneling.

Advances in consumer electronics cause demand for higher density memory devices. Efforts to manufacture devices meeting this demand often involve scaling down the sizes of gate structures and reducing or minimizing the space between adjacent gate structures.

With the reduction in channel length of transistors, the influence of a source and drain upon an electric field or potential in the channel region may increase. This is referred to as the 'short channel effect'.

Other related problems include trap-assisted leakage current. As shown in FIG. 37, in a conventional charge trap memory device 10, including a substrate 12, a tunnel insulating pattern 14, a charge storage pattern 16, a blocking insulating pattern 18, and a conductive pattern 20, electrons $e^-$ may leak from the charge storage pattern 16 through blocking insulating pattern 18 to the conductive pattern 20, for example, as a result of one or more defects D in the blocking insulating layer.

Conventional art publications have studied the characteristics of non-overlapped MOSFETs, and reported that performance degradation was suppressed by using a short non-overlap distance, for example, less than 10 nm. These results indicate that a non-overlapped structure is practically applicable.

Referring now to a conventional device from U.S. patent application Ser. No. 11/643,022, filed on Nov. 20, 2006, the entire contents of which are hereby incorporated by reference in their entirety, shown in FIG. 38, a memory may include a substrate 10, a channel region 40cC, a fringing field 90, an inversion layer 410, and an inversion layer at a source/drain region 430. As shown, a pass voltage of 5 V may be applied to memory transistors $MT_{n-1}$ and $MT_{n+1}$, and a select voltage Vsel may be applied to memory transistors $MT_n$. The fringing field 90 from the cell gate potential may cause source/drain inversion, which enables the channel region to conduct a charge.

Referring now to a conventional device from U.S. Pat. No. 7,081,651, shown in FIG. 39, a gate conductive pattern may be patterned to form a plurality of wordlines 140 crossing the first active regions 103 in the cell array region "a", and to form a gate electrode 240 at least on the second active region 203 in the peripheral circuit region "b".

The third insulating pattern 106 exposed between the plurality of wordlines 140 may be overetched or attacked by plasma while etching the gate conductive pattern. Therefore, a defect site may be created in the third insulating pattern 106 around an edge of a wordline 140. Subsequently, a trap-to-trap tunneling may occur through the defect site. Charges stored in a later-formed charge storage pattern may then be discharged to a gate electrode, having an undesirable influence on device operation.

Referring now to a conventional device from U.S. Pat. No. 6,674,122, shown in FIG. 40, a semiconductor integrated circuit device may include nonvolatile memory cells, each of which includes one memory transistor $T_{MC}$ and two switch transistors $T_{SW}$, wherein the memory transistor $T_{MC}$ includes a memory gate electrode 7 connected to a word line 5. The switch transistors $T_{SW}$ may each include a switch gate electrode 6-1 and 6-2, an inversion layer 20-1 and 20-2 which is formed below the switch gate electrode 6-1 and 6-2 by applying a voltage to the switch gate electrode 6-1 and 6-2, the inversion layer 20-1 and 20-2 functioning as a source or a drain of the memory transistor $T_{MC}$.

SUMMARY

Example embodiments improve or maximize device performance. Example embodiments may overcome the 'short channel effect' and/or trap-assisted leakage current.

Example embodiments are directed to a memory transistor including a substrate, a tunnel insulating pattern on the substrate, a charge storage pattern on the tunnel insulating pattern, a blocking insulating pattern on the charge storage pattern, and a gate electrode on the blocking insulating pattern, the blocking insulating pattern surrounding the gate electrode.

In example embodiments, a nonvolatile memory may further include a plurality of memory transistors in series and a plurality of auxiliary structures between each of the plurality of unit transistors in series.

In example embodiments, each of the plurality of auxiliary structures may be a dummy mask pattern.

In example embodiments, each dummy mask pattern may be an insulator.

In example embodiments, a nonvolatile memory may further include a select transistor at each end of the plurality of memory transistors, the select transistor including a blocking insulating pattern and a select gate electrode, the blocking insulating pattern surrounding the select gate electrode and a spacer between each select transistor and the plurality of memory transistors.

In example embodiments, the substrate may further include a doped region beneath the spacer.

In example embodiments, a nonvolatile memory may further include a dummy select transistor at each end of the plurality of memory transistors, the dummy select transistor including a blocking insulating pattern and a dummy select gate electrode, the blocking insulating pattern surrounding the dummy select gate electrode, a select transistor at each end of the dummy select transistors, the select transistor including a blocking insulating pattern and a select gate electrode, the blocking insulating pattern surrounding the select gate electrode, a first spacer between each dummy select transistor and the plurality of memory transistors, and a second spacer between each dummy select transistor and each select transistor.

In example embodiments, the substrate may further include a doped region beneath the first and second spacer.

In example embodiments, each of the plurality of auxiliary structures may be an assistant gate structure.

In example embodiments, each assistant gate structure may be a conductor.

In example embodiments, each assistant gate structure may include a blocking insulating pattern and an assistant gate electrode.

In example embodiments, a nonvolatile memory may further include a select transistor at each end of the plurality of unit transistors, the select transistor including a blocking insulating pattern and a select gate electrode, the blocking insulating pattern surrounding the select gate electrode and a spacer between each select transistor and the plurality of unit transistors.

In example embodiments, the substrate may further include a doped region beneath the spacer.

In example embodiments, a nonvolatile memory may further include a dummy select transistor at each end of the plurality of unit transistors, the dummy select transistor including a blocking insulating pattern and a dummy select gate electrode, the blocking insulating pattern surrounding the dummy select gate electrode, a select transistor at each end of the dummy select transistors, the select transistor including a blocking insulating pattern and a select gate electrode, the blocking insulating pattern surrounding the select gate electrode, a first spacer between each dummy select transistor and the plurality of unit transistors, and a second spacer between each dummy select transistor and each select transistor.

In example embodiments, the substrate may further include a doped region beneath the first and second spacer.

In example embodiments, a stacked nonvolatile memory structure may include a plurality of vertically stacked memories and an insulator between each of the plurality of vertically stacked memories.

In example embodiments, a system may include an interface for receiving data for the system and sending data external to the system, an I/O device for receiving input data from a user and outputting output data to the data, a controller for controlling operation of the system, a nonvolatile memory, storing commands executed by the controller, and a bus facilitating data transfer between the interface, the I/O device, the controller, and the nonvolatile memory.

Example embodiments are directed to a nonvolatile memory including at least one memory cell structure and at least one assistant gate cell structure, wherein when the at least one memory cell structure is in a programmed state, the at least one assistant gate cell structure is in a programmed state.

In example embodiments, during programming and read operations, the at least one assistant gate cell structure is biased by a positive voltage.

In example embodiments, during the programmed state and a read state, the at least one assistant gate cell structure is biased by a voltage greater than or equal to a voltage of the at least one memory cell structure or the at least one assistant gate cell structure is floating.

Example embodiments are directed to a method of programming a nonvolatile memory including programming at least one memory cell structure and at least one assistant gate cell structure such that the at least one memory cell structure and the at least one assistant gate cell structure are in a concurrently programmed state.

Example embodiments are directed to method of manufacturing a unit transistor including providing a substrate, forming a tunnel insulating pattern on the substrate, forming a charge storage pattern on the tunnel insulating pattern, forming a blocking insulating pattern on the charge storage pattern, and forming a gate electrode on the blocking insulating pattern such that the blocking insulating pattern surrounds the gate electrode.

In example embodiments, the method may further include forming a plurality of unit transistors in series and forming a plurality of auxiliary structures between each of the plurality of unit transistors in series.

In example embodiments, each of the plurality of auxiliary structures may be a dummy mask pattern.

In example embodiments, each dummy mask pattern may include a lower mask pattern and an upper mask pattern.

In example embodiments, each dummy mask pattern may be an insulator.

In example embodiments, the method may further include forming a select transistor at each end of the plurality of unit transistors including forming a blocking insulating pattern and a select gate electrode such that the blocking insulating pattern surrounds the select gate electrode and forming a spacer between each select transistor and the plurality of unit transistors.

In example embodiments, the method may further include forming a dummy select transistor at each end of the plurality of unit transistors including a blocking insulating pattern and a dummy select gate electrode such that the blocking insulating pattern surrounds the dummy select gate electrode, forming a select transistor at each end of the dummy select transistors including a blocking insulating pattern and a select gate electrode such that the blocking insulating pattern surround the select gate electrode, forming a first spacer between each dummy select transistor and the plurality of unit transistors, and forming a second spacer between each dummy select transistor and each select transistor.

In example embodiments, each of the plurality of auxiliary structures may be an assistant gate structure.

In example embodiments, each assistant gate structure may be a conductor.

In example embodiments, each assistant gate structure may include a blocking insulating pattern and an assistant gate electrode.

In example embodiments, the method may further include forming a select transistor at each end of the plurality of unit transistors including a blocking insulating pattern and a select gate electrode such that the blocking insulating pattern surrounds the select gate electrode and forming a spacer between each select transistor and the plurality of unit transistors.

In example embodiments, the method may further include forming a dummy select transistor at each end of the plurality of unit transistors including a blocking insulating pattern and a dummy select gate electrode such that the blocking insulating pattern surrounds the dummy select gate electrode, forming a select transistor at each end of the dummy select transistors including a blocking insulating pattern and a select gate electrode such that the blocking insulating pattern surrounds the select gate electrode, forming a first spacer between each dummy select transistor and the plurality of unit transistors, and forming a second spacer between each dummy select transistor and each select transistor.

Example embodiments are directed to a nonvolatile memory including a substrate, a plurality of unit transistors, each including a source region and a drain region in the substrate, and a plurality of assistant gates structures, above the source regions and drain regions.

BRIEF DESCRIPTION OF THE DRAWINGS

The above and other features and advantages of example embodiments will become more apparent by describing them in detailed with reference to the accompanying drawings.

DETAILED DESCRIPTION

Figure 1:
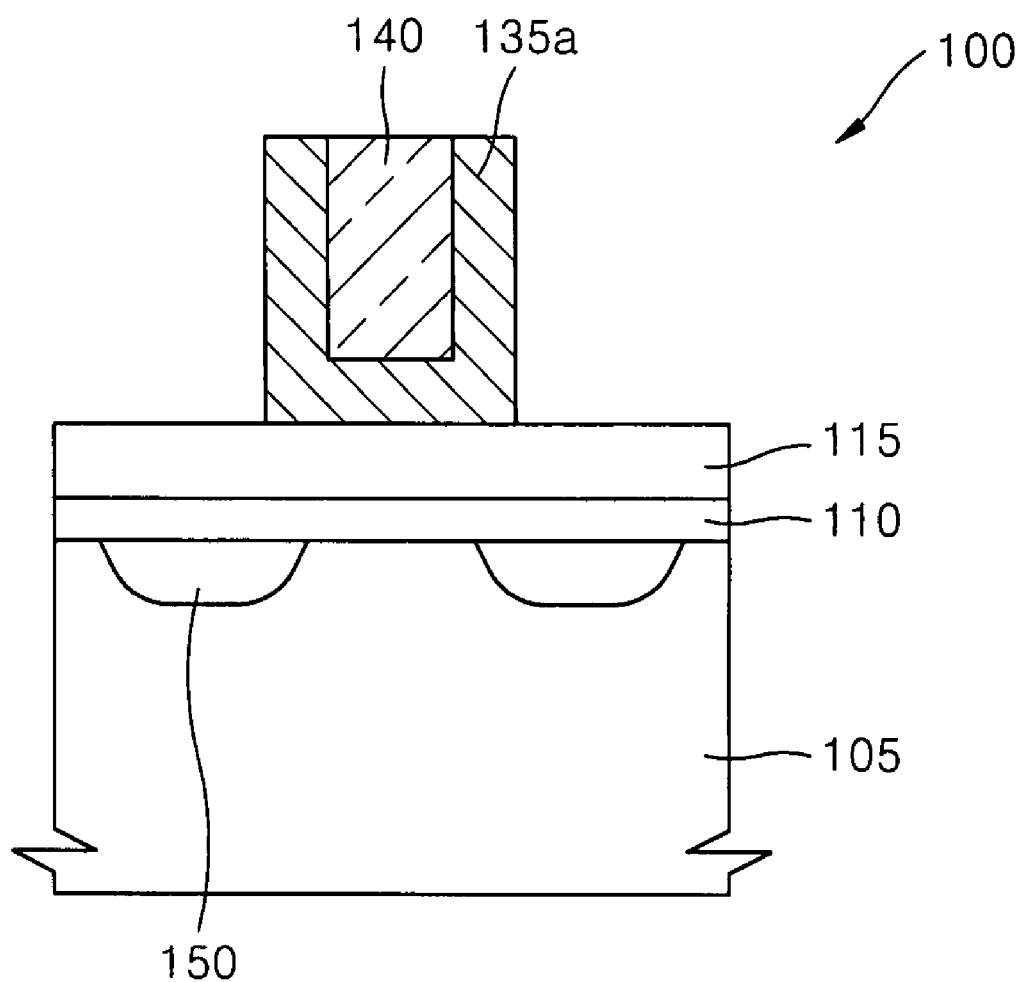
FIG. 1 illustrates a unit transistor in accordance with example embodiments.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions, illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

FIG. 1 illustrates a unit transistor in accordance with example embodiments. As illustrated in FIG. 1, a unit transistor 100 may include a substrate 105, a tunnel insulating pattern 110, a charge storage pattern 115, a blocking insulating pattern 135a, a control gate electrode 140, and/or source/drain regions 150. As illustrated in FIG. 1, the blocking insulating pattern 135a may surround the control gate electrode 140.

Figure 2:
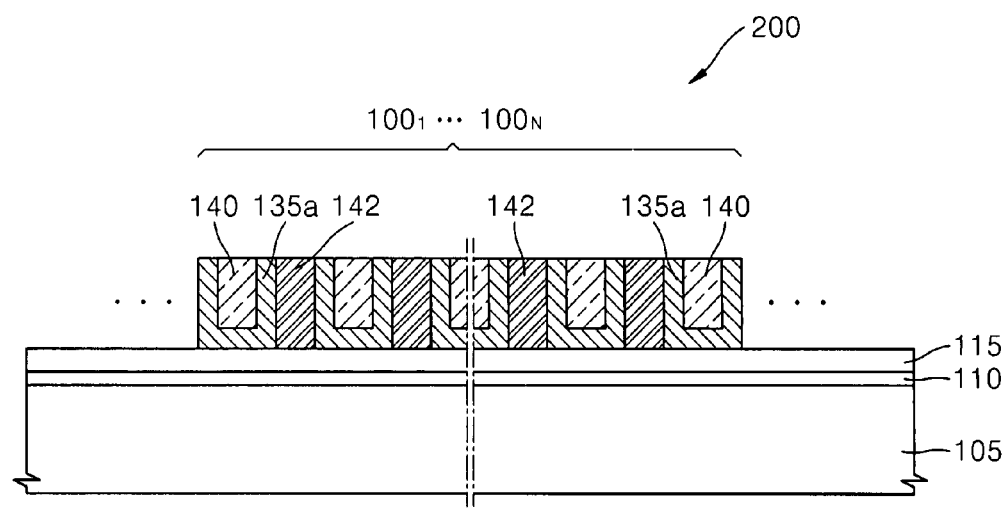
FIG. 2 illustrates a nonvolatile memory including a plurality of unit transistors in series in accordance with example embodiments.

FIG. 2 illustrates a nonvolatile memory 200 including a plurality of unit transistors $100_1 \ldots 100_N$ (where N>1) in series in accordance with example embodiments. As illustrated in FIG. 2, an auxiliary structure 142 is between each of the plurality of unit transistors $100_1 \ldots 100_N$ in series.

In example embodiments, the auxiliary structures 142 may be insulators. In other example embodiments, the auxiliary structures 142 may be conductors. In example embodiments, the auxiliary structures 142 may be dummy mask patterns. In other example embodiments, the auxiliary structures 142 may be assistant gate structures. Each of these example embodiments will be discussed in more detail below.

Figure 3:
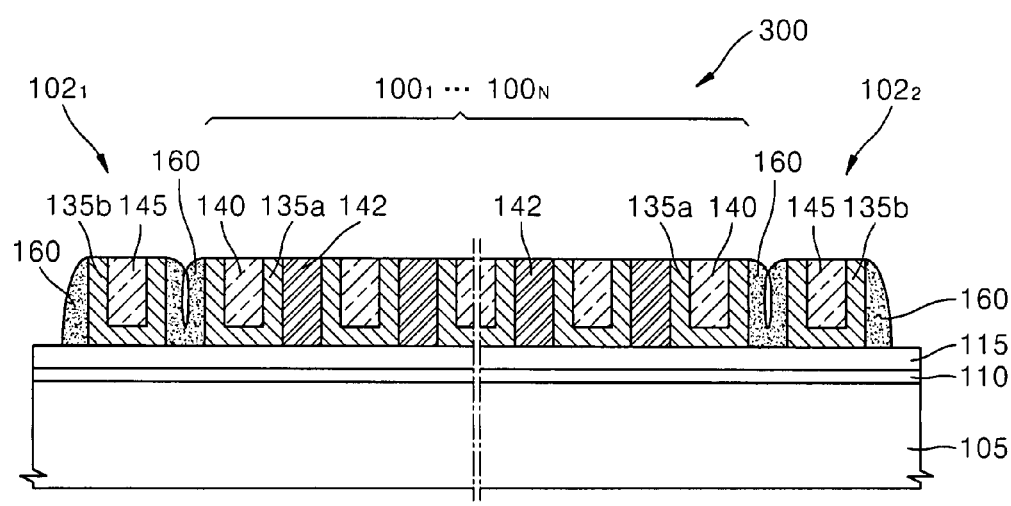
FIG. 3 illustrates a nonvolatile memory including a select transistor at each end of the series of unit transistors in accordance with example embodiments.

FIG. 3 illustrates a nonvolatile memory 300 including a select transistor $102_1, 102_2$, at each end of the series of unit transistors $100_1 \ldots 100_N$. Each select transistor $102_1, 102_2$ may include a blocking insulating pattern 135b and a select gate electrode 145, similar to the unit transistors $100_1 \ldots 100_N$. In example embodiments, the blocking insulating pattern 135b may surround the select gate electrode 145, similar to the unit transistors $100_1 \ldots 100_N$.

The nonvolatile memory 300 may further include spacers 160 between each select transistor $102_1, 102_2$ and the series of unit transistors $100_1 \ldots 100_N$. The spacer(s) 160 may be similar in shape to the auxiliary structures 142 or have a more conventional spacer shape as shown in FIG. 3.

Figure 4:
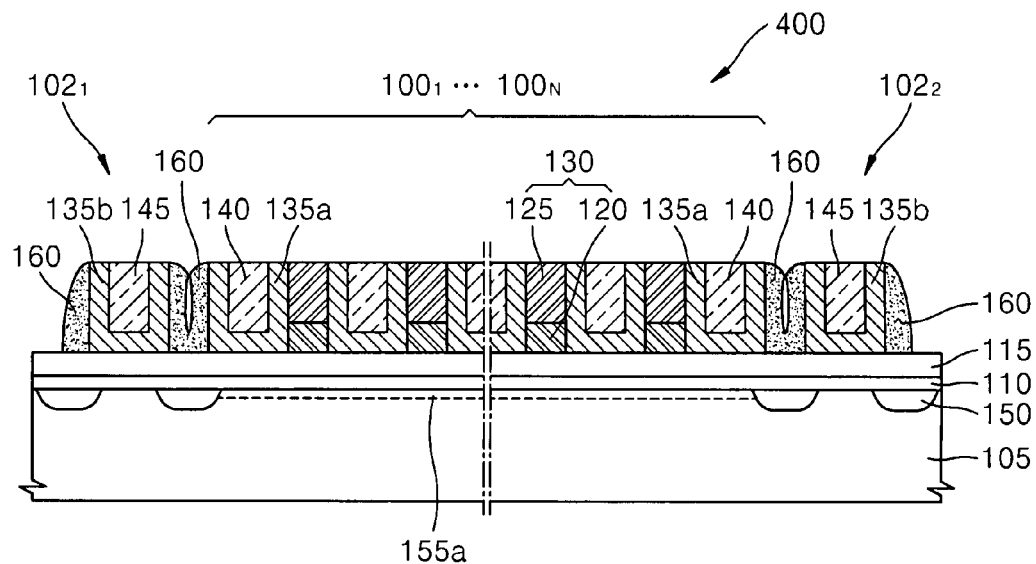
FIG. 4 illustrates a nonvolatile memory including dummy mask patterns as the auxiliary structures in accordance with example embodiments.

FIG. 4 illustrates a nonvolatile memory 400 including dummy mask patterns 130 as the auxiliary structures, in more detail. As shown, each dummy mask pattern 130 may include a lower mask pattern 120 and an upper mask pattern 125. The substrate 105 may further include a doped region beneath each dummy mask pattern 130 and each spacer 160. The substrate 105 may further include a channel 155a. FIG. 4 also illustrates select transistors $102_1, 102_2$ at each end of the series of unit transistors $100_1 \ldots 100_N$.

Figure 5:
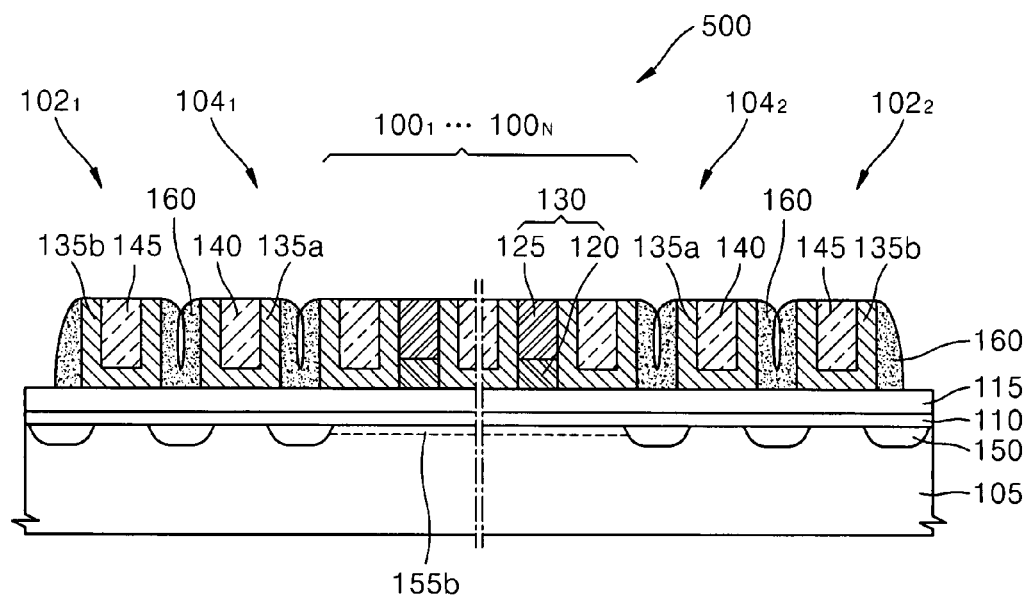
FIG. 5 illustrates a nonvolatile memory including a select transistor and a dummy select transistor at each end of the series of unit transistors in accordance with example embodiments.

FIG. 5 illustrates a nonvolatile memory 500 including a select transistor $102_1, 102_2$ and a dummy select transistor $104_1, 104_2$ at each end of the series of unit transistors $100_1 \ldots 100_N$. Each dummy select transistor $104_1, 104_2$ may include a blocking insulating pattern 135a and a dummy select gate electrode 140, similar to the unit transistors $100_1 \ldots 100_N$. In example embodiments, the blocking insulating pattern 135a may surround the dummy select gate electrode 140, similar to the unit transistors $100_1 \ldots 100_N$.

In example embodiments shown in FIGS. 3-5, the plurality of unit transistors $100_1 \ldots 100_N$ may be used as storage cells, arranged along a plurality of word lines and the number of control gates 140 may be variable according to the desired memory cell density. The select transistor $102_1, 102_2$ are used to select from the plurality of unit transistors $100_1 \ldots 100_N$. In example embodiments, the plurality of dummy mask patterns 130 may be formed between the plurality of word lines.

In example embodiments shown in FIG. 5, the dummy select transistor $104_1, 104_2$ are not usable as data storage but may decrease the interference between the select gate electrode of the select transistors $102_1, 102_2$ and the control gate electrode of the unit transistors $100_1 \ldots 100_N$.

In example embodiments shown in FIGS. 4-5, the substrate 105 may include a doped region beneath one or more of the spacer(s) 160.

In other example embodiments, a nonvolatile memory may include a plurality of unit transistors $100_1 \ldots 100_N$, each including a source region and a drain region in the substrate and a plurality of dummy mask patterns, above the source regions and drain regions.

Figure 6:
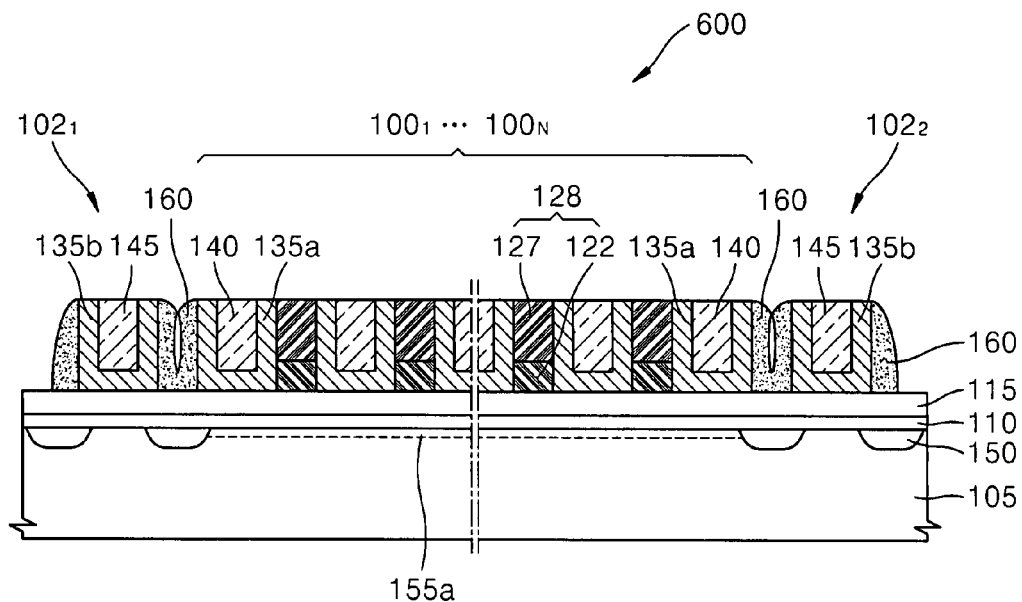
FIG. 6 illustrates a nonvolatile memory including assistant gate structures as the auxiliary structures in accordance with example embodiments.

FIG. 6 illustrates a nonvolatile memory 600 including assistant gate structures 128 as the auxiliary structures 142, in more detail. As shown, each assistant gate structure 128 may include a second blocking insulation pattern 122 and an assistant gate electrode 127. In example embodiments shown in FIG. 6, the assistant gate structures 128 are conductors.

Similar to FIG. 4, a select transistor $102_1, 102_2$ may be provided at each end of the plurality of unit transistors $100_1 \ldots 100_N$. The select transistors $102_1, 102_2$ may include a blocking insulating pattern 135b and a select gate electrode 145, where the blocking insulating pattern 135b surrounds the select gate electrode 145. The nonvolatile memory 600 may also include a spacer 160 between each select transistor $102_1, 102_2$ and the plurality of unit transistors $100_1 \ldots 100_N$.

The substrate 105 may further include a doped region beneath each assistant gate structures 128 and each spacer 160. The substrate 105 may further include a channel 155a.

Figure 7:
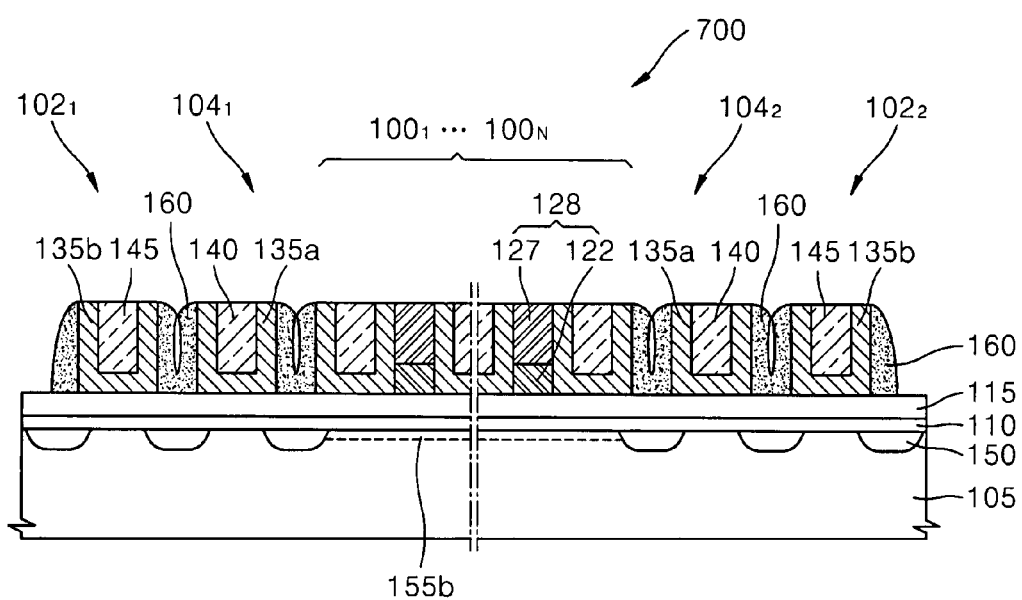
FIG. 7 illustrates a nonvolatile memory including a select transistor and a dummy select transistor at each end of the series of unit transistors in accordance with example embodiments.

FIG. 7 illustrates a nonvolatile memory 700 including a select transistor $102_1, 102_2$ and a dummy select transistor $104_1, 104_2$ at each end of the series of unit transistors $100_1 \ldots 100_N$. Each dummy select transistor $104_1, 104_2$ may include a blocking insulating pattern 135a and a dummy select gate electrode 140, similar to the unit transistors $100_1 \ldots 100_N$. In example embodiments, the blocking insulating pattern 135a may surround the dummy select gate electrode 140, similar to the unit transistors $100_1 \ldots 100_N$.

In example embodiments shown in FIGS. 6-7, the plurality of unit transistors $100_1 \ldots 100_N$ may be used as storage cells, arranged along a plurality of word lines and the number of control gates 140 may be variable according to the desired memory cell density. The select transistor $102_1$, $102_2$ are used to select from the plurality of unit transistors $100_1 \ldots 100_N$. In example embodiments, the plurality of assistant gate structures 12 may be formed between the plurality of word lines.

In example embodiments shown in FIG. 7, the dummy select transistor $104_1$, $104_2$ are not usable as data storage but may decrease the interference between the select gate electrode of the select transistors $102_1$, $102_2$ and the control gate electrode of the unit transistors $100_1 \ldots 100_N$.

In example embodiments shown in FIGS. 6-7, the substrate 105 may include a doped region beneath one or more of the spacer(s) 160.

In other example embodiments, a nonvolatile memory may include a plurality of unit transistors $100_1 \ldots 100_N$, each including a source region and a drain region in the substrate and a plurality of assistant gates structures, above the source regions and drain regions.

Figure 8:
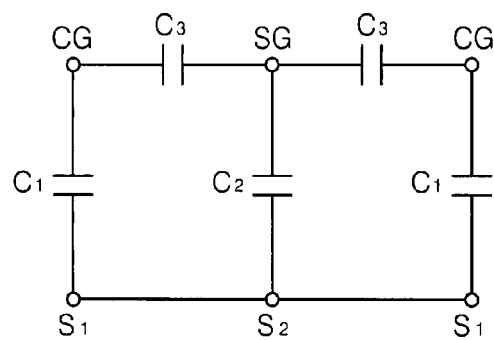
FIG. 8 illustrates an equivalent circuit which describes an example operation method in accordance with example embodiments.

FIG. 8 illustrates an equivalent circuit which describes an example operation method in more detail. As shown in FIG. 8, $S_1$ and $S_2$ designate the substrate 105, CG represents one or more control gate electrodes, for example, control gate electrodes 140 shown in FIGS. 6-7, and SG represents one or more assistant gate electrodes, for example, assistant gate electrodes 127, shown in FIGS. 6-7. Capacitances $C_1$ and $C_2$ represent capacitances between the control gate electrodes and the substrate and capacitances $C_3$ represent capacitances between the control gate electrodes and the assistant gate electrodes.

In a first method, the assistant gate electrode SG is always in the floating state, that is, the voltage applied thereto does not matter. In a second method, during a program/read operation, the assistant gate electrode SG is in a second pass voltage state. The second pass voltage may be similar to a pass voltage. In a third method, during program operation, the assistant gate electrode SG may be in a second pass voltage state. Charge may be stored below the assistant gate electrode SG because of the second voltage state, and is prevented from migrating from the data storage elements (for example, the plurality of unit transistors $100_1 \ldots 100_N$) due to repulsive force.

As described above, a nonvolatile memory may include at least one assistant gate cell structure, wherein when the at least one memory cell structure is in a programmed state, the at least one assistant gate cell structure is in a programmed state.

Using such a structure, a method of programming a nonvolatile memory many include programming at least one memory cell structure and at least one assistant gate cell structure such that the at least one memory cell structure and the at least one assistant gate cell structure are in a concurrently programmed state. As a result, in such a method, the assistant gate cell structure may assist the memory cell structure by storing additional charge.

As described above in example embodiments, the at least one assistant gate cell structure may be in floating state when the at least one memory cell structure is not in a programmed state. In example embodiments, during the programmed state and a read state, the at least one assistant gate cell structure and the at least one memory cell structure have the same pass voltage. In example embodiments, during the programmed state and the read state, the pass voltage of the at least one assistant gate cell structure prevents charge from migrating from the at least one memory cell structure.

Figure 9:
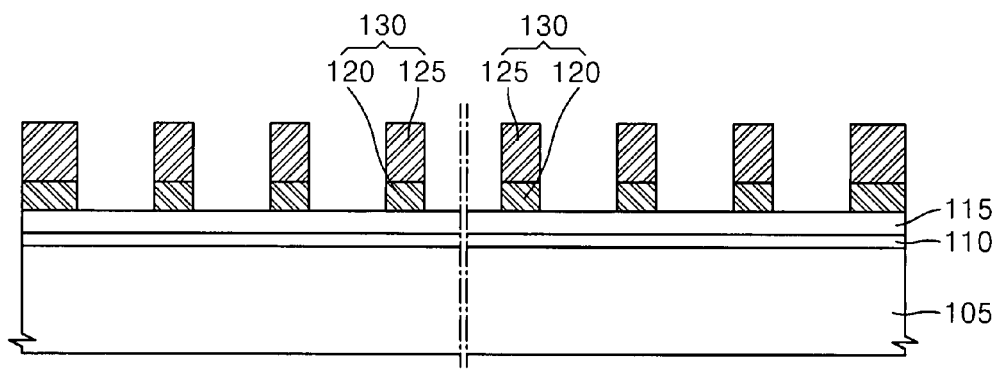
FIGS. 9-13 illustrate a method of forming a memory transistor in accordance with example embodiments.

FIGS. 9-13 illustrate a method of forming a memory transistor, for example the memory transistor of FIG. 4, in accordance with example embodiments. As shown in FIG. 9, the tunnel insulating pattern 110 and the charge storage pattern 115 may be formed on the substrate 105. A plurality of dummy mask patterns 130 may be formed on the charge storage pattern 115. The plurality of dummy mask patterns 130 may include a lower mask pattern 120 and an upper mask pattern 125.

Figure 10:
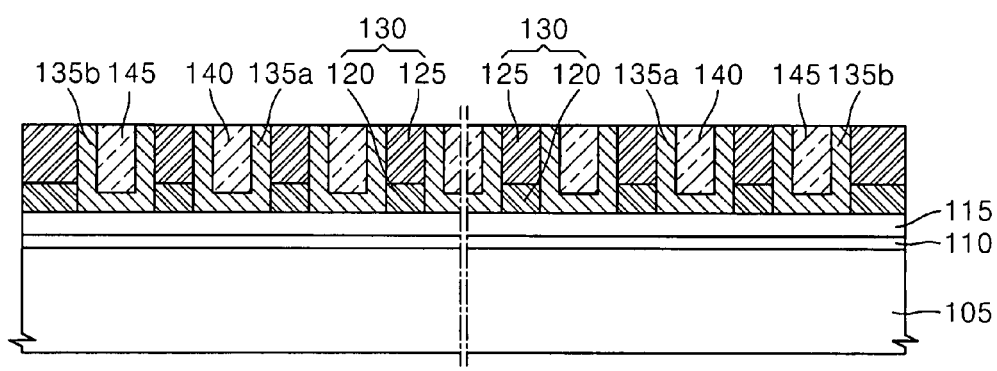

As illustrated in FIG. 10, a blocking insulating layer 135*a*, 135*b* and a conductive layer 140, 145 may be sequentially formed between the plurality of dummy mask patterns 130. Portions of the conductive layer 140, 145 and the block insulating layer 135*a*, 135*b* may be removed, for example, by chemical-mechanical polishing process (CMP) or an etch back process until the dummy mask layer is exposed.

In example embodiments, the blocking insulating layer 135*a* and 135*b* may be formed from the same layer at the same time or from different layers at different times. Similarly, in example embodiments, the conductive layer 140 and 145 may be formed from the same layer at the same time or from different layers at different times.

Figure 11:
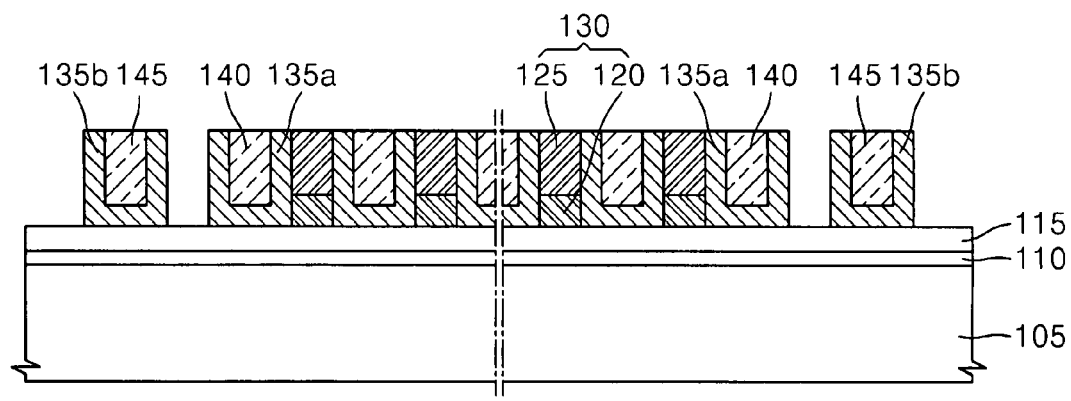

As illustrated in FIG. 11, the dummy mask pattern 130 may be selectively removed on one or both sides of the select transistor(s) select transistor $102_1$, $102_2$.

Figure 12:
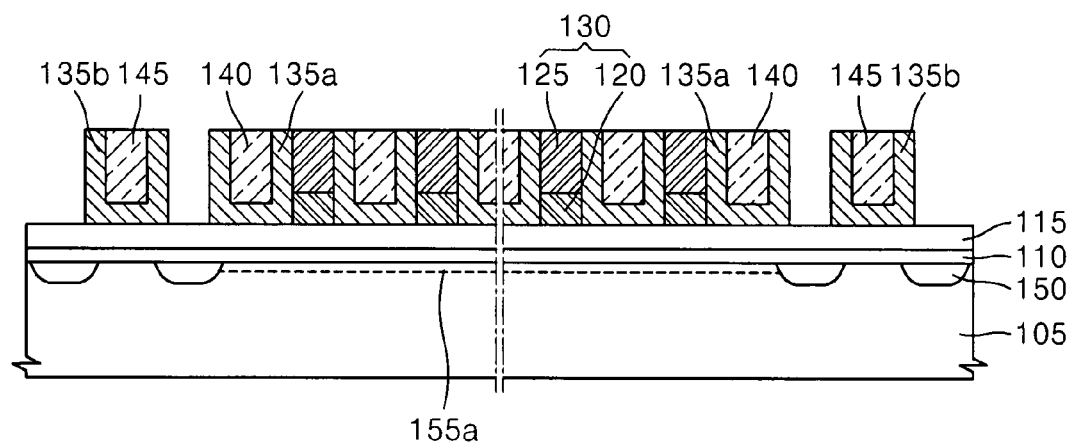

As shown in FIG. 12, doped regions, for example, source/drain regions 150 may be formed by ion implantation in the substrate 105 where the dummy mask pattern 130 has been selectively removed.

Figure 13:
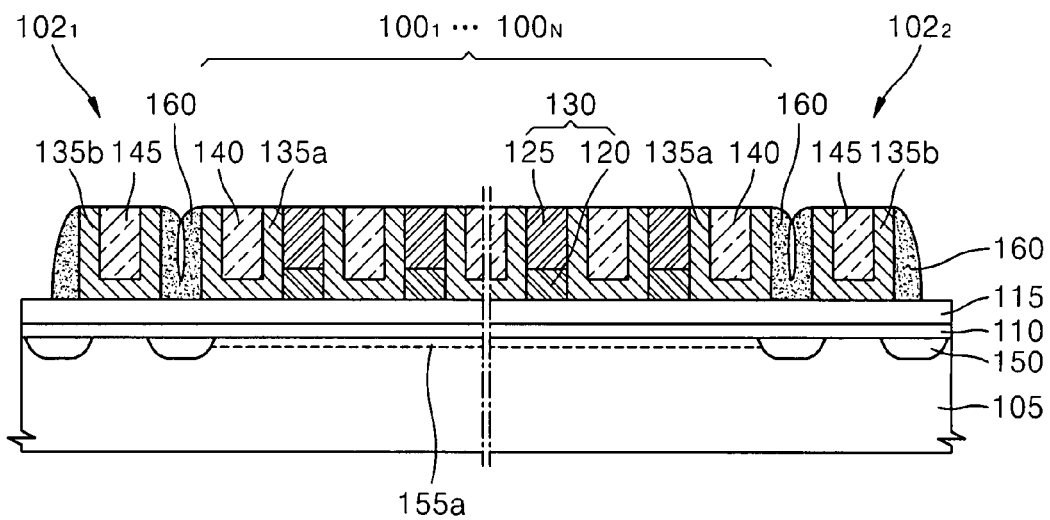

As illustrated in FIG. 13, a spacer insulating pattern 160 may be formed on one or both sides of the select transistor(s) select transistor $102_1$, $102_2$.

Figure 14:
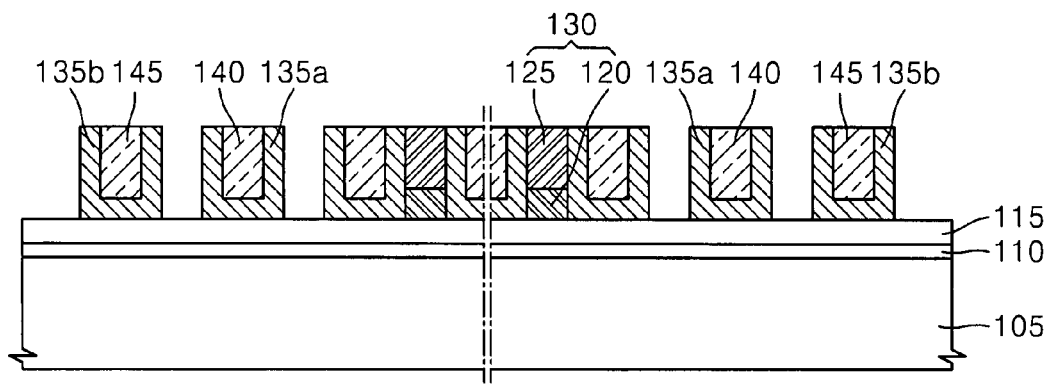
FIGS. 14-16 illustrate a method of forming a memory transistor in accordance with example embodiments.
Figure 15:
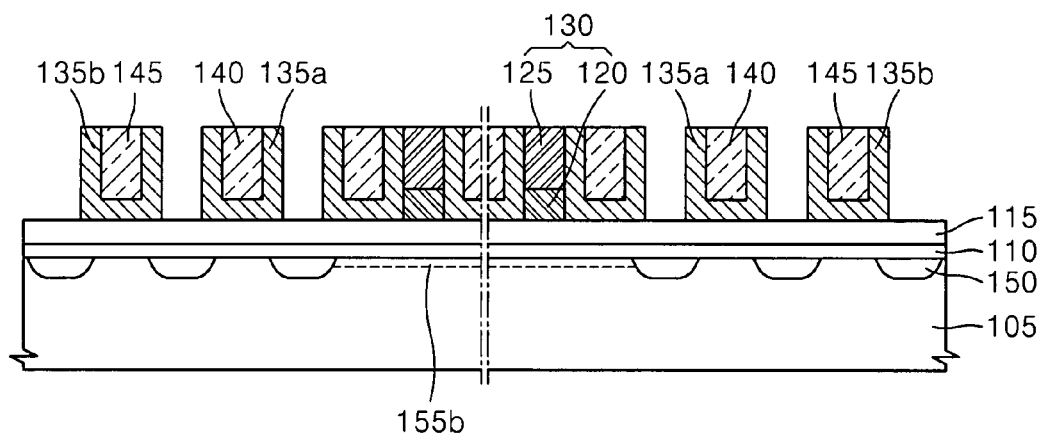
Figure 16:
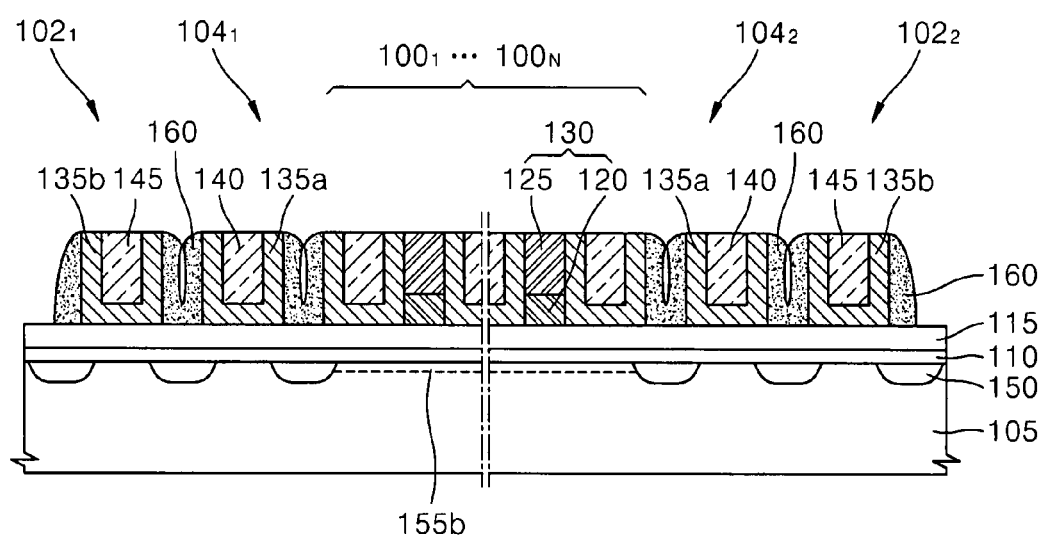

FIGS. 14-16 illustrate a method of forming a memory transistor, for example the memory transistor of FIG. 5, in accordance with example embodiments. As shown in FIG. 14, the tunnel insulating pattern 110 and the charge storage pattern 115 may be formed on the substrate 105. A plurality of dummy mask patterns 130 may be formed on the charge storage pattern 115. The plurality of dummy mask patterns 130 may include a lower mask pattern 120 and an upper mask pattern 125.

As illustrated in FIG. 14, a blocking insulating layer 135*a*, 135*b* and a conductive layer 140, 145 may be sequentially formed between the plurality of dummy mask patterns 130. Portions of the conductive layer 140, 145 and the block insulating layer 135*a*, 135*b* may be removed, for example, by chemical-mechanical polishing process (CMP) or an etch back process until the dummy mask layer is exposed.

In example embodiments, the blocking insulating layer 135*a* and 135*b* may be formed from the same layer at the same time or from different layers at different times. Similarly, in example embodiments, the conductive layer 140 and 145 may be formed from the same layer at the same time or from different layers at different times.

As illustrated in FIG. 15, the dummy mask pattern 130 may be selectively removed on one or both sides of the select transistor(s) select transistor $102_1$, $102_2$ and on one or both sides of the dummy select transistor $104_1$, $104_2$.

As shown in FIG. 15, doped regions, for example, source/drain regions 150 may be formed by ion implantation in the substrate 105 where the dummy mask pattern 130 has been selectively removed.

As illustrated in FIG. 16, a spacer insulating pattern 160 may be formed on one or both sides of the select transistor(s) select transistor $102_1$, $102_2$ and on one or both sides of the dummy select transistor $104_1$, $104_2$.

FIGS. 17-20 illustrate a method of forming a memory transistor, for example the memory transistor of FIG. 6, in accordance with example embodiments. As shown in FIG. 9, the tunnel insulating pattern 110 and the charge storage pattern 115 may be formed on the substrate 105. A plurality of assistant gate structures 128 may be formed on the charge storage pattern 115. The plurality of assistant gate structures 128 may include a second blocking insulation pattern 122 and an assistant gate electrode 127.

Figure 17:
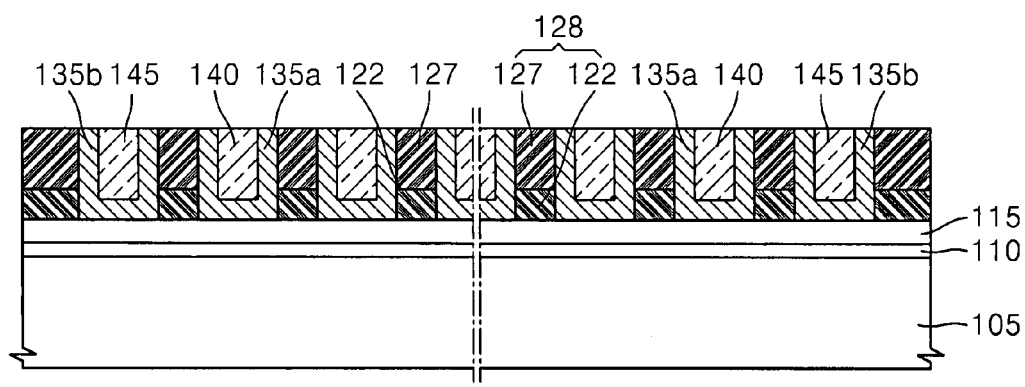
FIGS. 17-20 illustrate a method of forming a memory transistor in accordance with example embodiments.

As illustrated in FIG. 17, a blocking insulating layer 135$a$, 135$b$ and a conductive layer 140, 145 may be sequentially formed between the plurality of assistant gate structures 128. Portions of the conductive layer 140, 145 and the block insulating layer 135$a$, 135$b$ may be removed, for example, by chemical-mechanical polishing process (CMP) or an etch back process until the dummy mask layer is exposed.

In example embodiments, the blocking insulating layer 135$a$ and 135$b$ may be formed from the same layer at the same time or from different layers at different times. Similarly, in example embodiments, the conductive layer 140 and 145 may be formed from the same layer at the same time or from different layers at different times.

Figure 18:
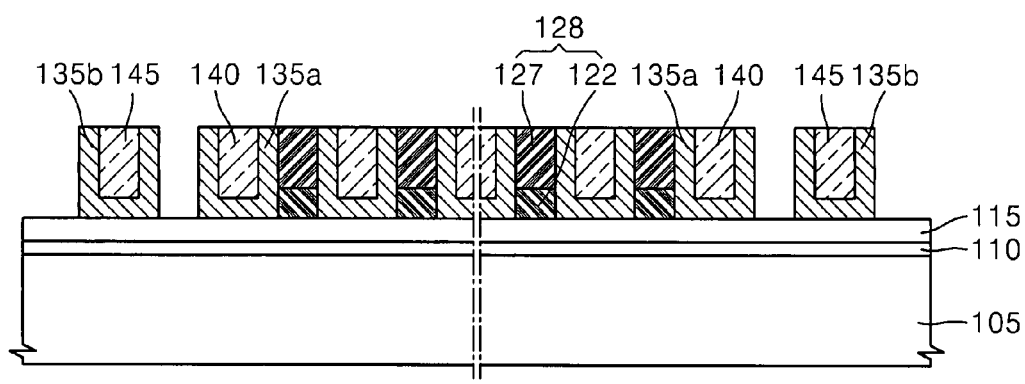

As illustrated in FIG. 18, the assistant gate structures 128 may be selectively removed on one or both sides of the select transistor(s) select transistor $102_1$, $102_2$.

Figure 19:
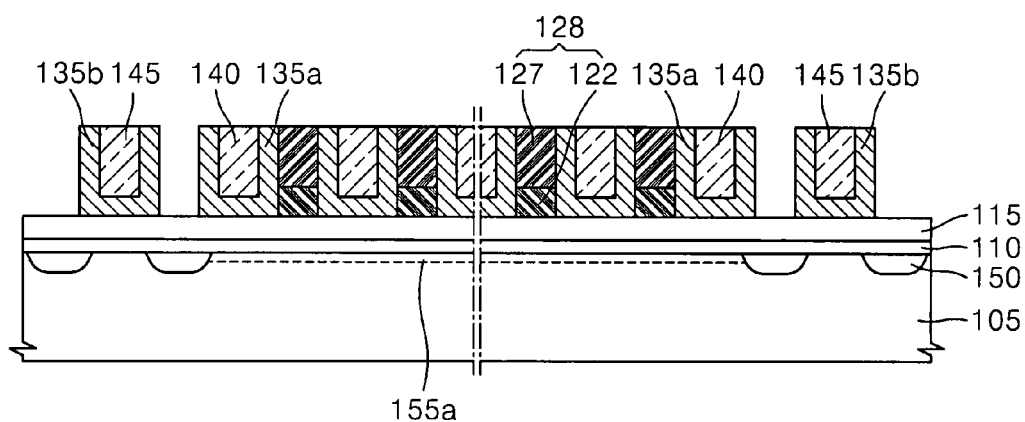
Figure 20:
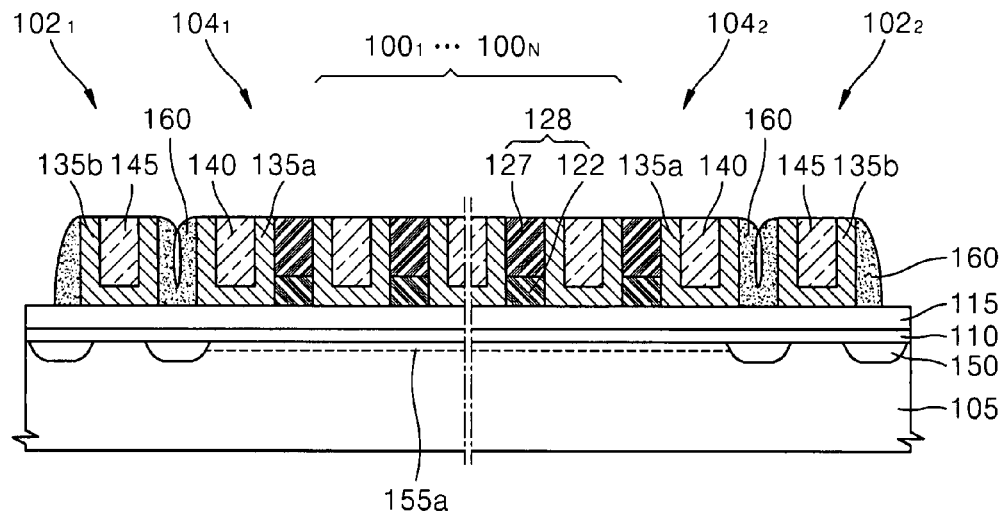

As shown in FIG. 19, doped regions, for example, source/drain regions 150 may be formed by ion implantation in the substrate 105 where the assistant gate structures 128 has been selectively removed.

s illustrated in FIG. 20, a spacer insulating pattern 160 may be formed on one or both sides of the select transistor(s) select transistor $102_1$, $102_2$.

Figure 21:
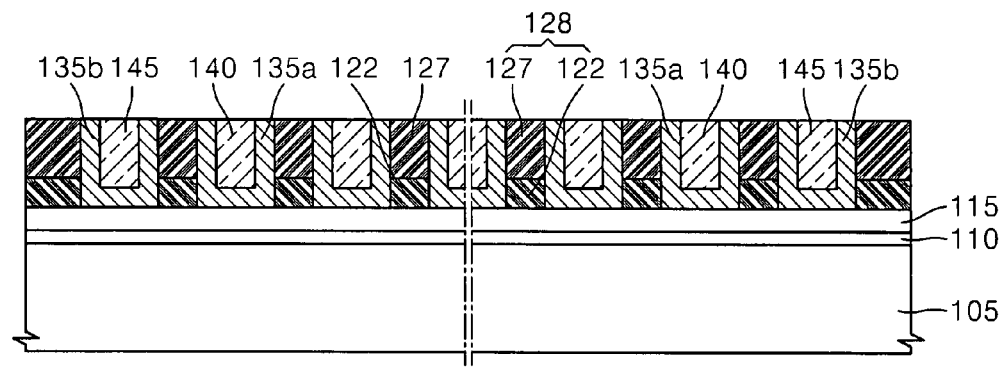
FIGS. 21-24 illustrate a method of forming a memory transistor in accordance with example embodiments.

FIGS. 21-24 illustrate a method of forming a memory transistor, for example the memory transistor of FIG. 7, in accordance with example embodiments. As shown in FIG. 21, the tunnel insulating pattern 110 and the charge storage pattern 115 may be formed on the substrate 105. A plurality of assistant gate structures 128 may be formed on the charge storage pattern 115. The plurality of dummy mask patterns 130 may include a second blocking insulation pattern 122 and an assistant gate electrode 127.

As illustrated in FIG. 21, a blocking insulating layer 135$a$, 135$b$ and a conductive layer 140, 145 may be sequentially formed between the plurality of assistant gate structures 128. Portions of the conductive layer 140, 145 and the block insulating layer 135$a$, 135$b$ may be removed, for example, by chemical-mechanical polishing process (CMP) or an etch back process until the dummy mask layer is exposed.

In example embodiments, the blocking insulating layer 135$a$ and 135$b$ may be formed from the same layer at the same time or from different layers at different times. Similarly, in example embodiments, the conductive layer 140 and 145 may be formed from the same layer at the same time or from different layers at different times.

Figure 22:
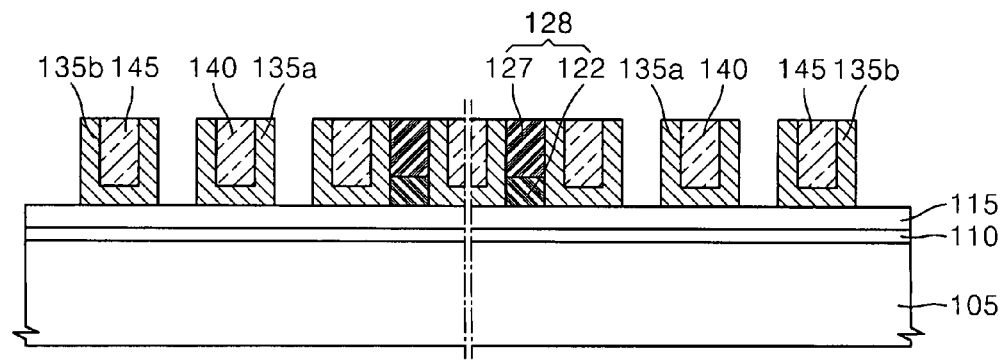

As illustrated in FIG. 22, the assistant gate structures 128 may be selectively removed on one or both sides of the select transistor(s) select transistor $102_1$, $102_2$ and on one or both sides of the dummy select transistor $104_1$, $104_2$.

Figure 23:
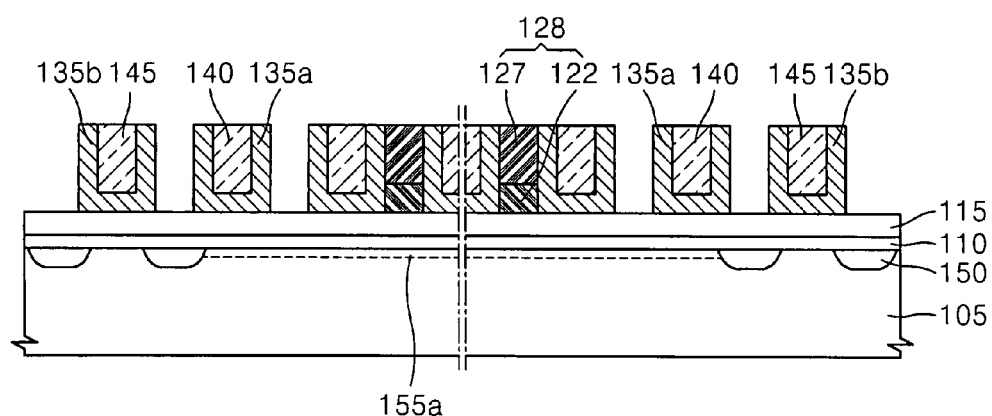

As shown in FIG. 23, doped regions, for example, source/drain regions 150 may be formed by ion implantation in the substrate 105 where the assistant gate structures 128 has been selectively removed.

Figure 24:
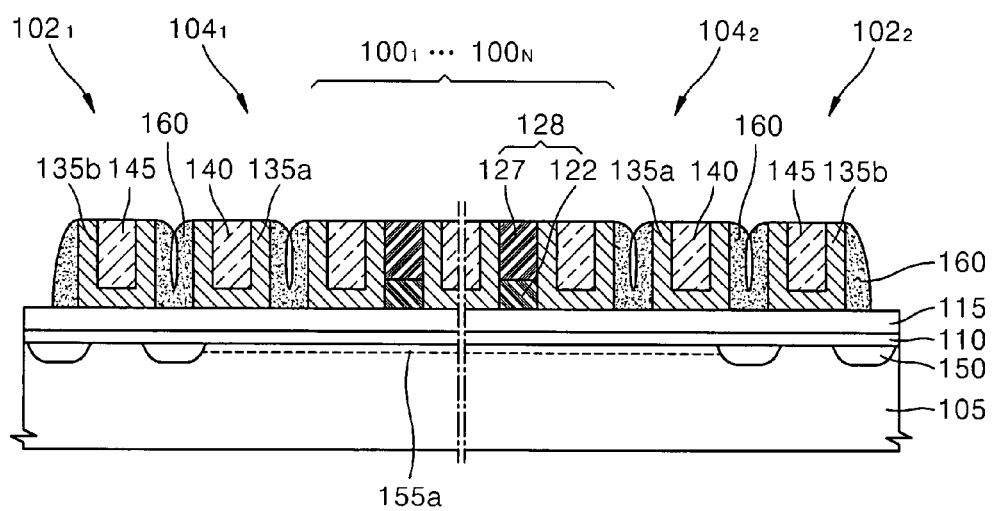

As illustrated in FIG. 24, a spacer insulating pattern 160 may be formed on one or both sides of the select transistor(s) select transistor $102_1$, $102_2$ and on one or both sides of the dummy select transistor $104_1$, $104_2$.

Although not explicitly shown in FIGS. 9-24 set forth above, it is apparent that a source and drain regions for the plurality of unit transistors may be formed prior to formation of the auxiliary structures and the assistant gates structures may then be formed on or above the source regions and drain regions of the plurality of unit transistors.

Figure 25:
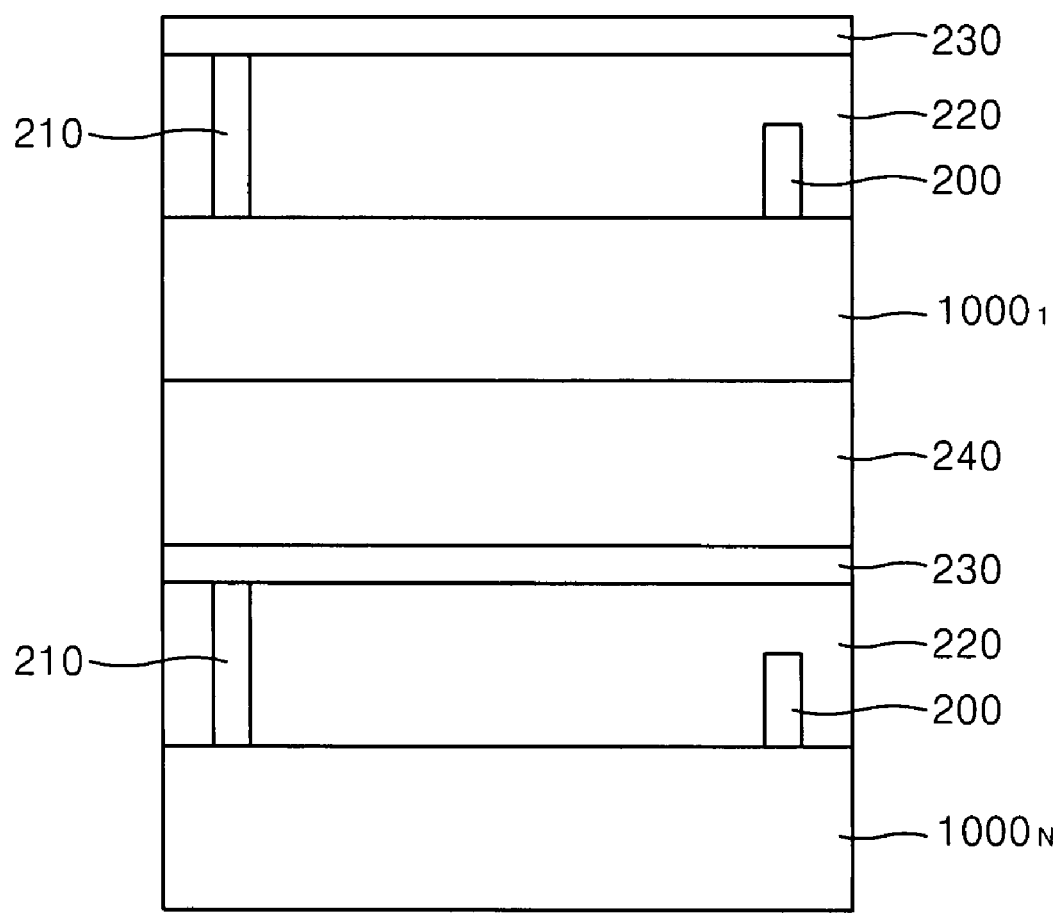
FIG. 25 illustrates an example of stacked memory transistors in accordance with example embodiments.

FIG. 25 illustrates an example of stacked memory transistors 100. Each of the example embodiments set forth above, for example, nonvolatile memories 100, 200, 300, 400, 500, 600, and/or 700 may be stacked in stacks of N where N>1. As illustrated in FIG. 25, the memory transistor stack may include a common source line (CSL) 200, a bit line contact 210, an interlayer dielectric (ILD) 220, a bit line 230, and/or a dielectric 240.

In example embodiments, the CSL 200 material may be selected from the group consisting of W, TiN, TaN, Cu, and mixtures thereof. The bit line contact 210 material may be selected from the group consisting of W, WN, TiN, TaN, Cu, and mixtures thereof. The interlayer dielectric (ILD) 220 material may be selected from the group consisting of $SiO_2$ and low-k dielectric material, BPSG, HDP, and mixtures thereof. The bit line 230 material may be selected from the group consisting of W, WN, TiN, TaN, Cu, and mixtures thereof. The dielectric 240 material may be selected from the group consisting of $SiO_2$ and low-k dielectric material, BPSG, HDP, and mixtures thereof.

As set forth above, in example embodiments illustrated in FIGS. 1-25, the gate structure is a charge trap gate structure including the tunnel insulating layer 110, the charge storage layer 115 on the tunnel insulating layer 110, the blocking insulating layer 135$a$ on the charge storage layer 115, and a gate electrode 140 on the blocking insulating layer 135$a$.

In example embodiments, the gate electrode 140 comprises a metal layer. In example embodiments, the blocking insulating layer 135$a$ may have a dielectric constant which is greater than a dielectric constant of the tunnel insulating layer 110.

In example embodiments, the tunnel insulating layer 110 may comprise one or more of silicon oxide, silicon oxynitride, and silicon nitride. In example embodiments, the charge storage layer 115 may comprise one or more of silicon nitride, silicon oxynitride, silicon-rich oxide, metallic oxynitride and other metallic oxide materials. In example embodiments, the blocking insulating layer 135$a$ may comprise metallic oxide or metallic oxynitride of a group III element or group VB elements in the Mendeleef Periodic Table.

According to example embodiments, the blocking insulating layer 135$a$ may comprise doped metal oxide or doped metal oxynitride in which metal oxide is doped with a group IV element in the Mendeleef Periodic Table. In example embodiments, the blocking insulating layer 135$a$ may also comprise one of more of $HfO_2Al_2O_3$, $La_2O_3$, $Hf_{1-x}Al_xO_y$, $Hf_xSi_{1-x}O_2$, Hf—Si-oxynitride, $ZrO_2$, $Zr_xSi_{1-x}O_2$, Zr—Si-oxynitride, and combinations thereof.

The metal layer of the gate electrode 140 may have a work-function of, for example, at least 4 eV. The metal layer may be one of titanium, titanium nitride, tantalum nitride, tantalum, tungsten, hafnium, niobium, molybdenum, ruthenium dioxide, molybdenum nitride, iridium, platinum, cobalt, chrome, ruthenium monoxide, titanium aluminide ($Ti_3Al$), $Ti_2AlN$, palladium, tungsten nitride ($WN_x$), tungsten silicicide (WSi), nickel silicide, or combinations thereof.

In other example embodiments, the charge trap gate structure may be an ONO structure. In example embodiments, the ONO structure may include a first oxide layer, a nitride layer on the first oxide layer, and a second oxide layer on the nitride layer.

In other example embodiment as described above the gate structure may be a floating gate structure. Regarding gate structures, the contents of U.S. Patent Application No. 2004/0169238, filed on Mar. 8, 2004, are incorporated by reference herein, in their entirety.

Figure 26:
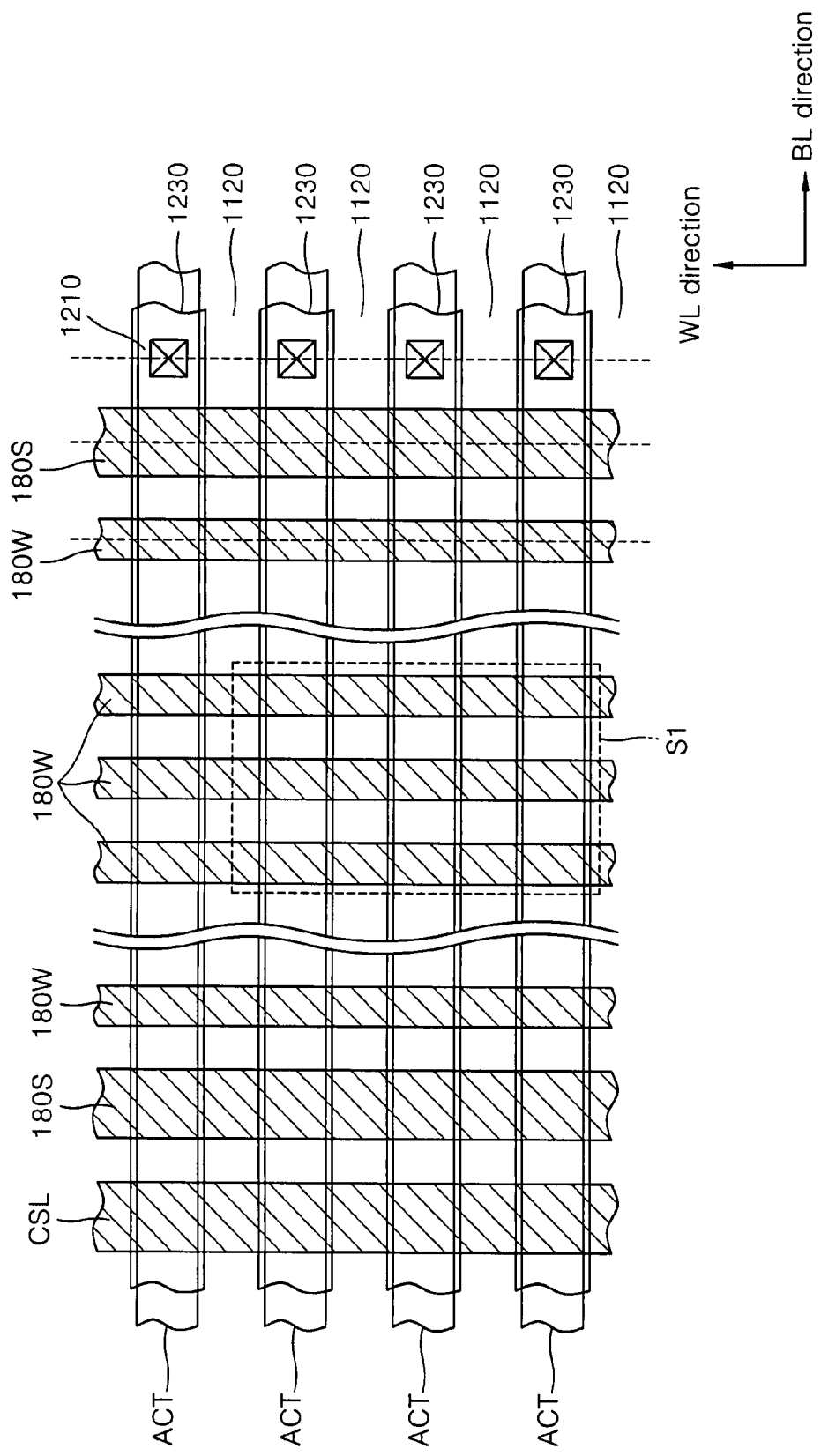
FIG. 26 illustrates a plan view of NAND flash memory cells in accordance with example embodiments.

FIG. 26 illustrates a plan view of NAND flash memory cells in accordance with example embodiments. As shown, NAND flash memory cells may include isolation regions 1120, select gates 180S, word lines (or gate patterns) 180W, bit line contacts 1210, bit lines 1230, a common source line CSL, and/or active regions ACT. Each of the NAND flash memory cells illustrated in FIG. 26 may be implemented as a nonvolatile memories 100, 200, 300, 400, 500, 600, and/or 700 of any one of FIGS. 1-25.

Figure 27:
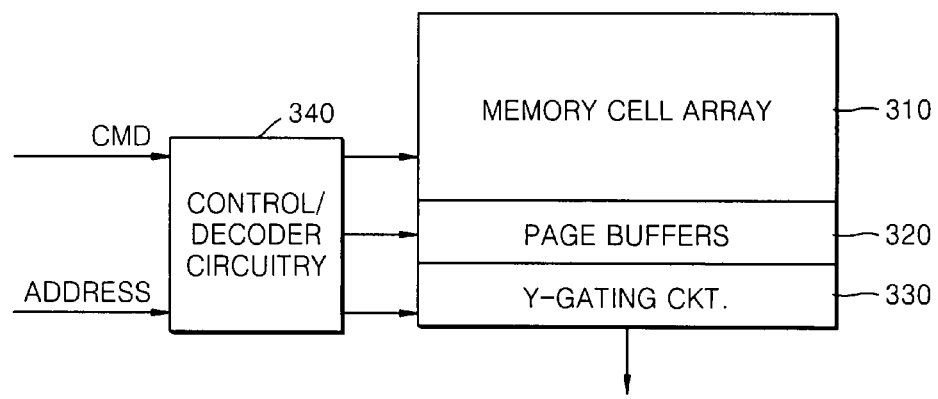
FIG. 27 illustrates a NAND flash memory in accordance with example embodiments.

FIG. 27 illustrates a NAND flash memory in accordance with example embodiments. As shown, the NAND flash memory may include a memory array 310 of memory cells to store data, a page buffer block 320, a Y-gating circuit 330 and/or control/decoder circuitry 340 for controlling the operation of the memory array 310, the page buffer block 320, and the Y-gating circuit 330. The control/decoder circuitry 340 may receive command signals and an address, and generates control signals for controlling the memory array 310, the page buffer block 320, and the Y-gating circuit 330.

Figure 28:
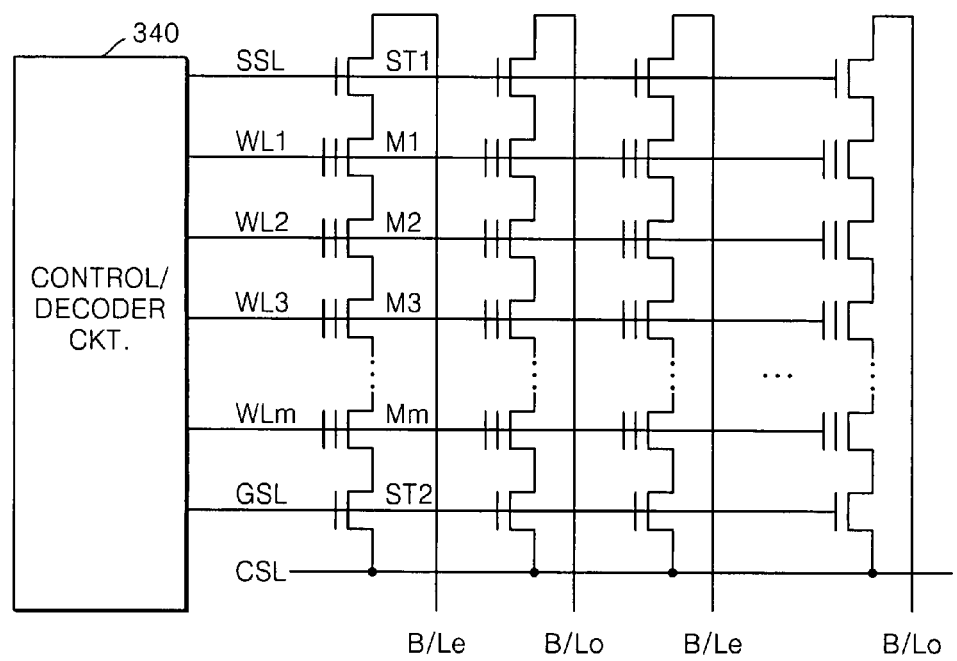
FIG. 28 illustrates an example of a portion of a memory array in accordance with example embodiments.

FIG. 28 illustrates an example of a portion of the memory array 310 in accordance with example embodiments. As shown, the memory array 310 may include a plurality of bit lines B/Le, B/Lo, where "e" and "o" designate even and odd bit lines. The memory cell array 310 may include a plurality of cell strings each respectively connected to one of bit lines B/Le and B/Lo. Each cell string in the illustrated example may be formed from a string selection transistor SST (for example, select transistors $102_1$, $102_2$ described above) connected to its corresponding bit line, a ground selection transistor GST (for example, select transistors $102_1$, $102_2$ described above) connected to a common source line CSL, and a plurality of memory cells $M_1$-$M_m$ (for example, unit transistors $100_1 \ldots 100_N$ described above) connected in series between the string selection transistor SST and the ground selection transistor GST. Each string selection transistor SST, ground selection transistor GST, and memory cell M1-$M_m$ may be formed according to one of the above described example embodiments. While not shown in FIG. 28, more than one string may be connected to a bit line. Each bit line may be connected to a respective page buffer in the page buffer block 320.

The page buffer block 320 may include a plurality of page buffers for reading and writing data into the memory array 310 based on the control signals from the control/decoder circuitry 340. The Y-gating circuit 330 may select page buffers in the page buffer block 320 for input of data or output of data based on the control signals from the control/decoder circuitry 340. Because the structure and operation of the page buffer block 320, the Y-gating circuit 330 and the control/decoder circuitry 340 are so well-known, the structure and operation of these elements will not be described in detail for the sake of brevity. Instead, U.S. Pat. No. 7,042,770 illustrating an example NAND flash memory, which may employ example embodiments, is hereby incorporated by reference in its entirety.

Furthermore, it will be appreciated that example embodiments are not limited in application to a NAND flash memory having the architecture described above with respect to FIGS. 26-28. Instead, example embodiments may be applied to the cell array of various NAND flash memory architectures.

Figure 29:
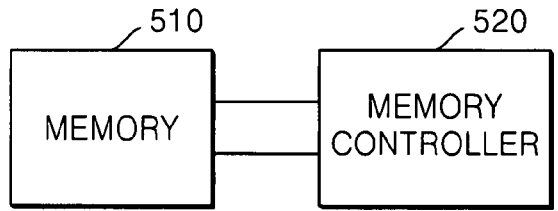
FIG. 29 illustrates another example embodiment including a memory controller in accordance with example embodiments.

FIG. 29 illustrates another example embodiment. As shown, FIG. 32 includes a memory 510 connected to a memory controller 520. The memory 510 may be the NAND flash memory discussed above. However, the memory 510 is not limited to these memory architectures, and may be any memory architecture having memory cells formed according to example embodiments.

The memory controller 520 may supply the input signals for controlling operation of the memory 510. For example, in the case of the NAND flash memory of FIGS. 27-28, the memory controller 520 may supply the command CMD and address signals. It will be appreciated that the memory controller 520 may control the memory 510 based on received control signals (not shown).

Figure 30:
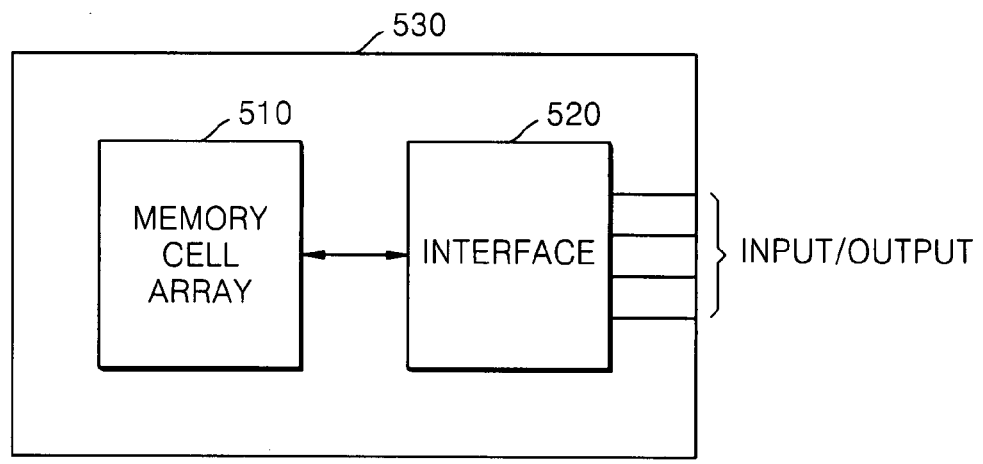
FIG. 30 illustrates another example embodiment including an interface in accordance with example embodiments.

FIG. 30 illustrates another example embodiment. As shown, FIG. 30 includes a memory 510 connected to an interface 515. The memory 510 may be the NAND flash memory discussed above. However, the memory 510 is not limited to these memory architectures, and may be any memory architecture having memory cells formed according to example embodiments.

The interface 515 may supply the input signals (for example, generated externally) for controlling operation of the memory 510. For example, in the case of the NAND flash memory of FIGS. 27-28, the interface 515 may supply the command CMD and address signals. It will be appreciated that the interface 515 may control the memory 510 based on received control signals (for example, generated externally, but not shown).

Figure 31:
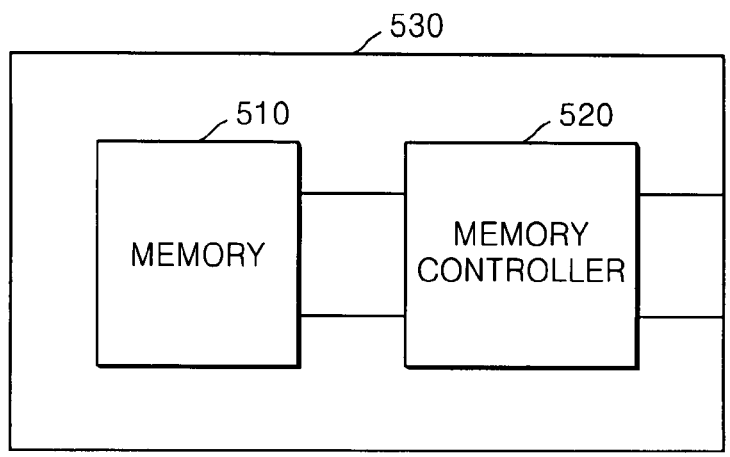
FIG. 31 illustrates an example memory card in accordance with example embodiments.

FIG. 31 illustrates another example embodiment. FIG. 31 is similar to FIG. 29, except that the memory 510 and memory controller 520 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 520 may control the memory 510 based on controls signals received by the card 530 from another (e.g., external) device.

Figure 32:
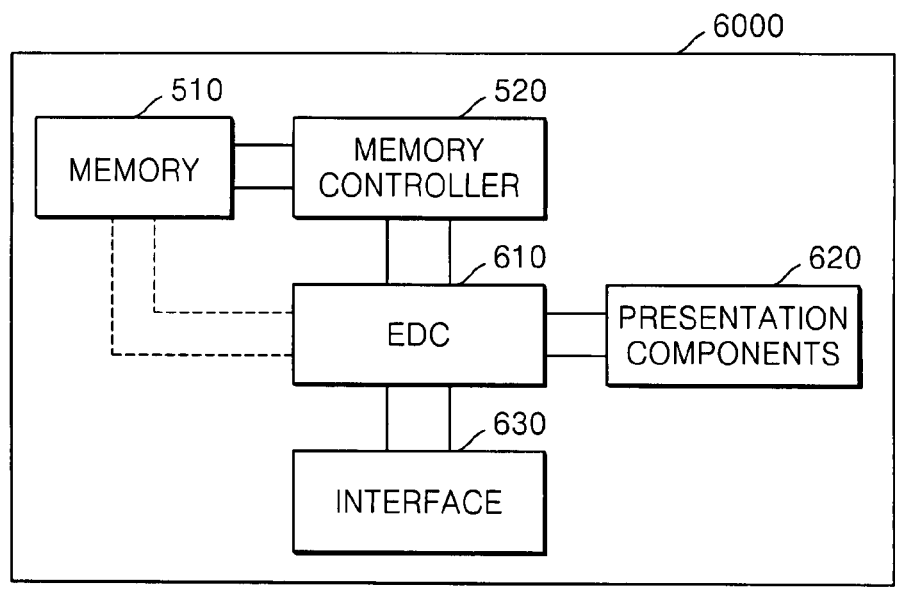
FIG. 32 illustrates an example portable device in accordance with example embodiments.

FIG. 32 illustrates another example embodiment. FIG. 32 represents a portable device 6000. The portable device 6000 may be an MP3 player, video player, combination video and audio player, etc. As shown, the portable device 6000 includes the memory 510 and memory controller 520. The portable device 6000 may also includes an encoder and decoder 610, presentation components 620 and interface 630.

Data (video, audio, etc.) may be input to and output from the memory 510 via the memory controller 520 by an encoder and decoder (EDC) 610. As shown by the dashed lines in FIG. 32, the data may be directly input to the memory 510 from the EDC 610 and/or directly output from the memory 510 to the EDC 610.

The EDC 610 may encode data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510. Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 33:
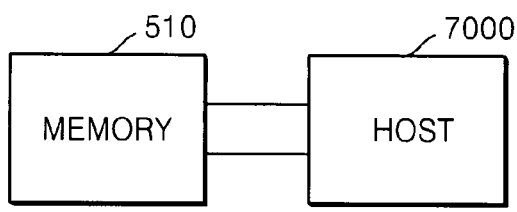
FIG. 33 illustrates an example host system in accordance with example embodiments.

FIG. 33 illustrates another example embodiment. As shown, the memory 510 may be connected with a host system 7000. The host system 7000 may be a processing system such as a personal computer, digital camera, etc. The host system 7000 may use the memory 510 as a removable storage medium. As will be appreciated, the host system 7000 supplies the input signals for controlling operation of the memory 510. For example, in the case of the NAND flash memory of FIGS. 27-28, the host system 7000 supplies the command CMD and address signals.

Figure 34:
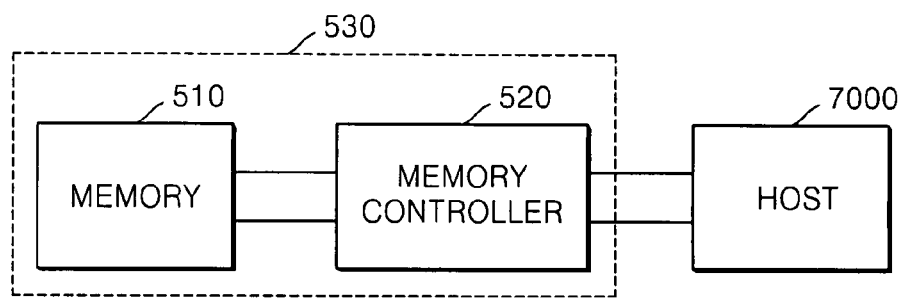
FIG. 34 illustrates an example memory card and host system in accordance with example embodiments.

FIG. 34 illustrates example embodiments in which the host system 7000 is connected to the card 530 of FIG. 31. In example embodiments, the host system 7000 may apply control signals to the card 530 such that the memory controller 520 controls operation of the memory 510.

Figure 35:
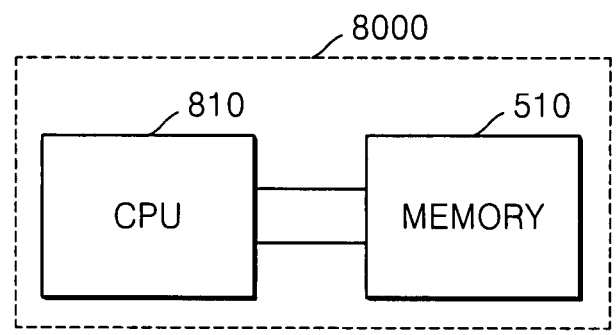
FIG. 35 illustrates an example computer system in accordance with example embodiments.

FIG. 35 illustrates other example embodiments. As shown, the memory 510 may be connected to a central processing unit (CPU) 810 within a computer system 8000. For example, the computer system 8000 may be a personal computer, personal data assistant, etc. The memory 510 may be directly connected with the CPU 810, connected via bus, etc. It will be appreciated, that FIG. 35 does not illustrate the full complement of components that may be included within a computer system 8000 for the sake of clarity.

Figure 36:
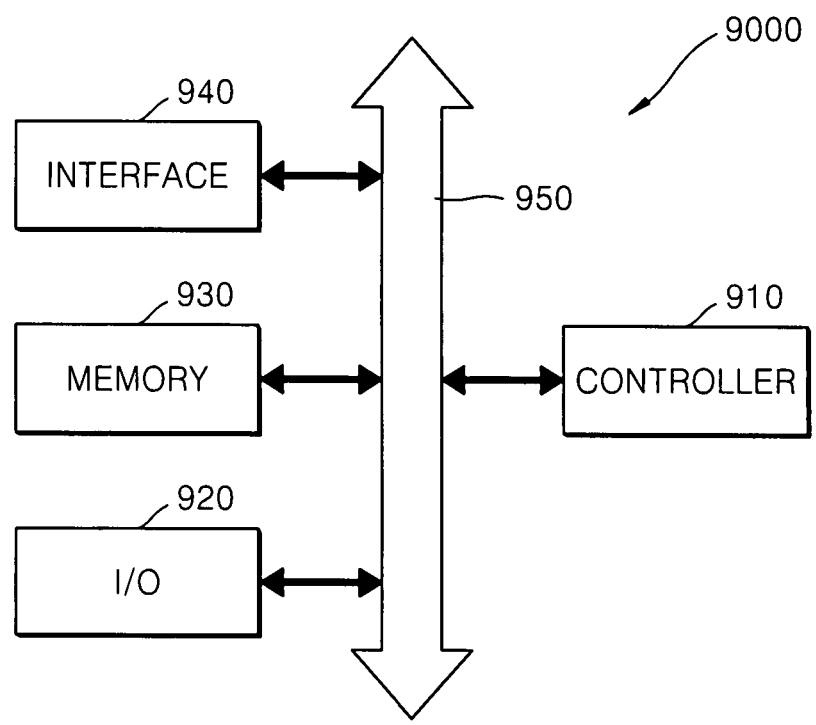
FIG. 36 illustrates an example system in accordance with example embodiments.
Figure 37:
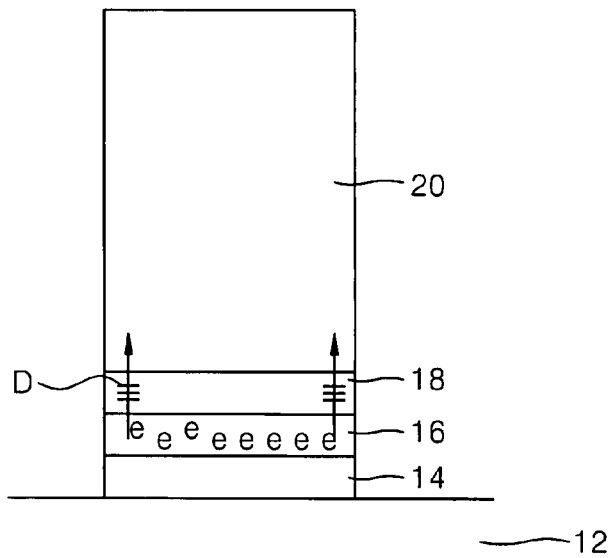
FIG. 37 illustrates a conventional charge trap memory device including a trap-assisted leakage current.
Figure 38:
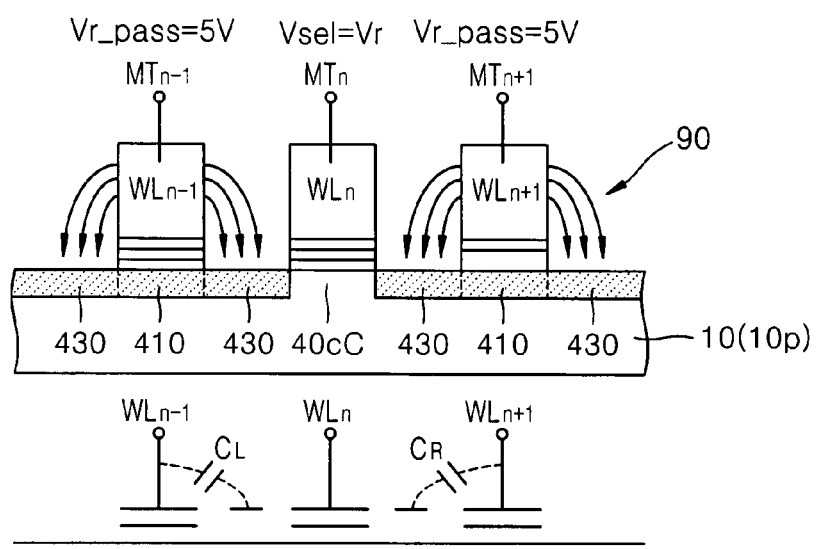
FIG. 38-40 illustrate conventional memory devices.
Figure 39:
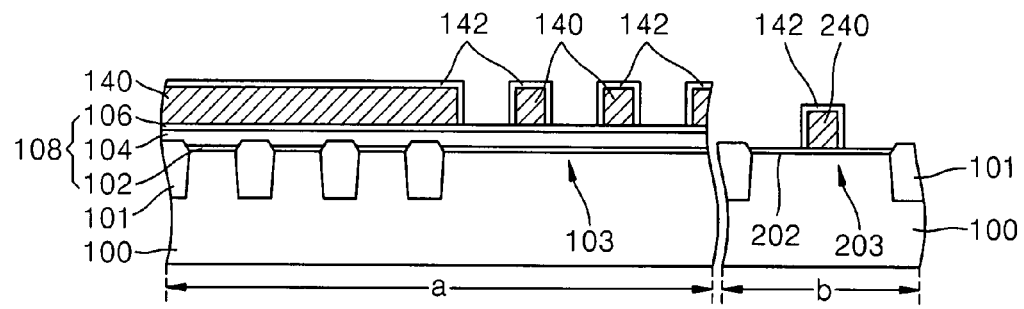
Figure 40:
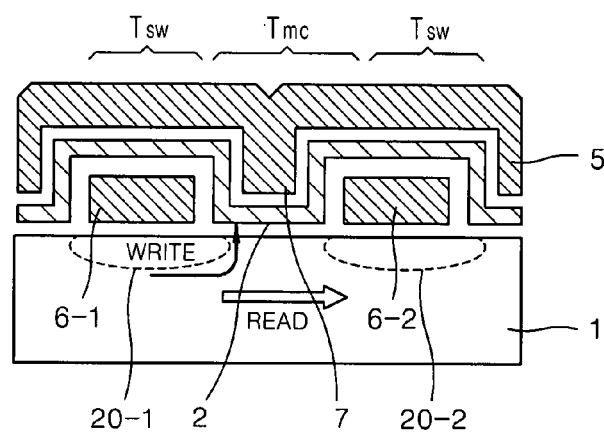

FIG. 36 illustrates other example embodiments. As shown, system 900 may include a controller 910, an input/output device 920, for example, a keypad, a keyboard, and/or a display, a memory 930, and/or an interface 940. In example embodiments, each of the system elements may be combined each other through a bus 950.

The controller 910 may include one or more microprocessors, a digital signal processor, a microcontroller, or any processor similar to the above. The memory 930 may be used to store data and/or commands executed by the controller 910. The memory 930 may be any of any of the memories described in example embodiments above.

The interface 940 may be used to transmit data to and/or from another system, for example, a communication network. The system 900 may be part of a mobile system, such as a PDA, a portable computer, web tablet, a wireless phone, a mobile phone, a digital music player, memory card, or other system transmitting and/or receiving information.

Example embodiments being thus described, it will be obvious that the same may be varied in many ways. Such variations are not to be regarded as a departure from example embodiments, and all such modifications are intended to be included within the scope of append claims.

What is claimed:

1. A memory transistor, comprising:
    a substrate;
    a tunnel insulating pattern on the substrate;
    a charge storage pattern on the tunnel insulating pattern;
    a blocking insulating pattern on the charge storage pattern; and
    a gate electrode on the blocking insulating pattern, the blocking insulating pattern being formed on sidewalls and a lower surface of the gate electrode.

2. A nonvolatile memory, comprising:
    a plurality of memory transistors of claim 1 in series; and
    a plurality of auxiliary structures between each of the plurality of memory transistors in series.

3. The nonvolatile memory of claim 2, wherein each of the plurality of auxiliary structures is a dummy mask pattern.

4. The nonvolatile memory of claim 3, wherein each dummy mask pattern is an insulator.

5. The nonvolatile memory of claim 3, further comprising:
    a select transistor at each end of the plurality of memory transistors, the select transistor including a blocking insulating pattern and a select gate electrode, the blocking insulating pattern surrounding the select gate electrode; and
    a spacer between each select transistor and the plurality of memory transistors.

6. The nonvolatile memory of claim 5, the substrate further including a doped region beneath the spacer.

7. The nonvolatile memory of claim 3, further comprising:
    a dummy select transistor at each end of the plurality of memory transistors, the dummy select transistor including a blocking insulating pattern and a dummy select gate electrode, the blocking insulating pattern surrounding the dummy select gate electrode;
    a select transistor at each end of the dummy select transistors, the select transistor including a blocking insulating pattern and a select gate electrode, the blocking insulating pattern surrounding the select gate electrode;
    a first spacer between each dummy select transistor and the plurality of memory transistors; and
    a second spacer between each dummy select transistor and each select transistor.

8. The nonvolatile memory of claim 7, the substrate further including a doped region beneath the first and second spacer.

9. The nonvolatile memory of claim 2, wherein each of the plurality of auxiliary structures is an assistant gate structure.

10. The nonvolatile memory of claim 9, wherein each assistant gate structure is a conductor.

11. The nonvolatile memory of claim 10, wherein each assistant gate structure includes a blocking insulating pattern and an assistant gate electrode.

12. The nonvolatile memory of claim 9, further comprising:
    a select transistor at each end of the plurality of memory transistors, the select transistor including a blocking insulating pattern and a select gate electrode, the blocking insulating pattern surrounding the select gate electrode; and
    a spacer between each select transistor and the plurality of memory transistors.

13. The nonvolatile memory of claim 12, the substrate further including a doped region beneath the spacer.

14. The nonvolatile memory of claim 9, further comprising:
    a dummy select transistor at each end of the plurality of memory transistors, the dummy select transistor including a blocking insulating pattern and a dummy select gate electrode, the blocking insulating pattern surrounding the dummy select gate electrode;
    a select transistor at each end of the dummy select transistors, the select transistor including a blocking insulating pattern and a select gate electrode, the blocking insulating pattern surrounding the select gate electrode;

a first spacer between each dummy select transistor and the plurality of memory transistors; and a second spacer between each dummy select transistor and each select transistor.

15. The nonvolatile memory of claim 14, the substrate further including a doped region beneath the first and second spacer.

16. A stacked nonvolatile memory structure, comprising:
a plurality of vertically stacked memories of claim 2; and
an insulator between each of the plurality of vertically stacked memories.

17. A system, comprising:
an interface for receiving data for the system and sending data external to the system;
an I/O device for receiving input data from a user and outputting output data to the data;
a controller for controlling operation of the system;
the nonvolatile memory of claim 2, storing commands executed by the controller; and
a bus facilitating data transfer between the interface, the I/O device, the controller, and the nonvolatile memory.

18. A method of manufacturing a unit transistor, comprising:
providing a substrate;
forming a tunnel insulating pattern on the substrate;
forming a charge storage pattern on the tunnel insulating pattern;
forming a blocking insulating pattern on the charge storage pattern; and
forming a gate electrode on the blocking insulating pattern such that the blocking insulating pattern is formed on sidewalls and a lower surface of the gate electrode.

19. The method of claim 18, further comprising:
forming a plurality of unit transistors in series; and
forming a plurality of auxiliary structures between each of the plurality of unit transistors in series.

20. The method of claim 19, wherein each of the plurality of auxiliary structures is a dummy mask pattern.

21. The method of claim 20, wherein each dummy mask pattern is an insulator.

22. The method of claim 21, wherein each dummy mask pattern includes a lower mask pattern and an upper mask pattern.

23. The method of claim 20, further comprising:
forming a select transistor at each end of the plurality of unit transistors including forming a blocking insulating pattern and a select gate electrode such that the blocking insulating pattern surrounds the select gate electrode; and
forming a spacer between each select transistor and the plurality of unit transistors.

24. The method of claim 20, further comprising:
forming a dummy select transistor at each end of the plurality of unit transistors including a blocking insulating pattern and a dummy select gate electrode such that the blocking insulating pattern surrounds the dummy select gate electrode;
forming a select transistor at each end of the dummy select transistors including a blocking insulating pattern and a select gate electrode such that the blocking insulating pattern surround the select gate electrode;
forming a first spacer between each dummy select transistor and the plurality of unit transistors; and
forming a second spacer between each dummy select transistor and each select transistor.

25. The method of claim 19, wherein each of the plurality of auxiliary structures is an assistant gate structure.

26. The method of claim 25, wherein each assistant gate structure is a conductor.

27. The method of claim 26, wherein each assistant gate structure includes a blocking insulating pattern and an assistant gate electrode.

28. The method of claim 25, further comprising:
forming a select transistor at each end of the plurality of unit transistors including a blocking insulating pattern and a select gate electrode such that the blocking insulating pattern surrounds the select gate electrode; and
forming a spacer between each select transistor and the plurality of unit transistors.

29. The method of claim 25, further comprising:
forming a dummy select transistor at each end of the plurality of unit transistors including a blocking insulating pattern and a dummy select gate electrode such that the blocking insulating pattern surrounds the dummy select gate electrode;
forming a select transistor at each end of the dummy select transistors including a blocking insulating pattern and a select gate electrode such that the blocking insulating pattern surrounds the select gate electrode;
forming a first spacer between each dummy select transistor and the plurality of unit transistors; and
forming a second spacer between each dummy select transistor and each select transistor.

30. A nonvolatile memory, comprising:
a plurality of memory transistors arranged in series, each of the plurality of memory transistors including,
a substrate,
a tunnel insulating pattern on the substrate,
a charge storage pattern on the tunnel insulating pattern,
a blocking insulating pattern on the charge storage pattern, and
a gate electrode on the blocking insulating pattern, the blocking insulating pattern surrounding the gate electrode;
a plurality of auxiliary structures between each of the plurality of memory transistors in series;
a select transistor at each end of the plurality of memory transistors, the select transistor including a blocking insulating pattern and a select gate electrode, the blocking insulating pattern surrounding the select gate electrode; and
a spacer between each select transistor and the plurality of memory transistors.

31. A method comprising:
forming at least one unit transistor, the forming of the at least one unit transistor including,
providing a substrate,
forming a tunnel insulating pattern on the substrate,
forming a charge storage pattern on the tunnel insulating pattern,
forming a blocking insulating pattern on the charge storage pattern, and
forming a gate electrode on the blocking insulating pattern such that the blocking insulating pattern surrounds the gate electrode;
forming a select transistor at each end of the at least one unit transistors, the forming of the select transistor including,
forming a blocking insulating pattern and a select gate electrode such that the blocking insulating pattern surrounds the select gate electrode; and
forming a spacer between each select transistor and the at least one unit transistors.

* * * * *